US010121951B2

(12) United States Patent
Itoh et al.

(10) Patent No.: US 10,121,951 B2
(45) Date of Patent: Nov. 6, 2018

(54) LIGHT-EMITTING DEVICE SUBSTRATE, LIGHT-EMITTING DEVICE, AND METHOD FOR PRODUCING LIGHT-EMITTING DEVICE SUBSTRATE

(71) Applicant: Sharp Kabushiki Kaisha, Osaka-shi, Osaka (JP)

(72) Inventors: Shin Itoh, Osaka (JP); Masahiro Konishi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/033,252

(22) PCT Filed: Nov. 12, 2014

(86) PCT No.: PCT/JP2014/079943
§ 371 (c)(1),
(2) Date: Apr. 29, 2016

(87) PCT Pub. No.: WO2015/079913
PCT Pub. Date: Jun. 4, 2015

(65) Prior Publication Data

US 2016/0247993 A1 Aug. 25, 2016

(30) Foreign Application Priority Data

Nov. 29, 2013 (JP) ................................ 2013-248562

(51) Int. Cl.
*H01L 21/02* (2006.01)
*H01L 33/64* (2010.01)
(Continued)

(52) U.S. Cl.
CPC ...... *H01L 33/641* (2013.01); *H01L 21/02258* (2013.01); *H01L 25/0753* (2013.01);
(Continued)

(58) Field of Classification Search
CPC ... H01L 33/641; H01L 25/0753; H01L 33/44; H01L 33/502; H01L 33/56; H01L 33/60;
(Continued)

(56) References Cited

U.S. PATENT DOCUMENTS

2005/0212986 A1* 9/2005 Kawasaki ......... G02F 1/134363 349/43
2008/0257585 A1* 10/2008 Morse .................... C25D 11/04 174/252
(Continued)

FOREIGN PATENT DOCUMENTS

JP 59-149958 A 8/1984
JP 2006-332382 A 12/2006
(Continued)

OTHER PUBLICATIONS

Official Communication issued in International Patent Application No. PCT/JP2014/079943, dated Feb. 24, 2015.

*Primary Examiner* — Eric Ward
*Assistant Examiner* — Eric Ashbahian
(74) *Attorney, Agent, or Firm* — Keating & Bennett, LLP

(57) ABSTRACT

In a light-emitting device substrate (2), a light reflecting surface covered with an anodized aluminum layer (12) is formed on one side of a base (14), and a glass-based insulator layer (11) and electrode patterns (5•6) disposed on the first insulating layer (11) are formed on the one side of the base (14) in a region not covered with the anodized aluminum layer (12). A glass-based insulator layer (13) is formed at least on the other side of the base (14) that is opposite the one side of the base (14). Therefore, a light-emitting device substrate having high reflectivity, high heat dissipation capability, dielectric withstand capability, and long-term reliability and excellent in mass productivity can be realized.

1 Claim, 25 Drawing Sheets

(51) Int. Cl.

| | |
|---|---|
| ***H01L 33/60*** | (2010.01) |
| ***H01L 33/44*** | (2010.01) |
| ***H01L 33/62*** | (2010.01) |
| ***H01L 25/075*** | (2006.01) |
| ***H01L 33/50*** | (2010.01) |
| ***H01L 33/56*** | (2010.01) |

(52) U.S. Cl.
CPC ............ *H01L 33/44* (2013.01); *H01L 33/502* (2013.01); *H01L 33/56* (2013.01); *H01L 33/60* (2013.01); *H01L 33/62* (2013.01); *H01L 2224/83192* (2013.01); *H01L 2933/0016* (2013.01); *H01L 2933/0033* (2013.01); *H01L 2933/0058* (2013.01); *H01L 2933/0066* (2013.01); *H01L 2933/0075* (2013.01)

(58) Field of Classification Search
CPC .............. H01L 33/62; H01L 21/02258; H05K 2201/2054; Y10T 29/49169; C25D 5/022
USPC ............................................................ 257/88
See application file for complete search history.

(56) References Cited

U.S. PATENT DOCUMENTS

2009/0078455 A1* 3/2009 Takakusaki ............ H05K 1/056 174/260
2009/0301770 A1* 12/2009 Cho ......................... C25D 5/48 174/257
2010/0103680 A1 4/2010 Oyaizu et al.
2012/0091495 A1* 4/2012 Hatanaka ................ H01L 33/60 257/98
2012/0113650 A1 5/2012 Inoue
2013/0000952 A1* 1/2013 Srinivas ................... H01B 1/02 174/126.1
2013/0037833 A1* 2/2013 Nam ................... H01L 25/0753 257/88
2013/0133932 A1* 5/2013 Jang ..................... H05K 3/0061 174/255
2014/0021851 A1* 1/2014 Heo ....................... H05B 33/02 313/113
2015/0124451 A1* 5/2015 Zanon .................... H05K 1/185 362/249.02

FOREIGN PATENT DOCUMENTS

JP 2009-081196 A 4/2009
JP 4389840 B2 12/2009
JP 2010-135749 A 6/2010
JP 2011-171379 A 9/2011
JP 2012-015485 A 1/2012
JP 2012-069749 A 4/2012
JP 2012-102007 A 5/2012

* cited by examiner

1:LIGHT-EMITTING DEVICE
2:SUBSTRATE
5:POSITIVE ELECTRODE PATTERN
6:NEGATIVE ELECTRODE PATTERN
7:LIGHT-EMITTING ELEMENT

2:SUBSTRATE
5:POSITIVE ELECTRODE PATTERN
6:NEGATIVE ELECTRODE PATTERN
11:GLASS-BASED INSULATOR LAYER
12:ANODIZED ALUMINUM LAYER
13:GLASS-BASED INSULATOR LAYER/CERAMIC INSULATOR LAYER
14:ALUMINUM BASE

FIG. 5

| | THERMAL CONDUCTIVITY $\sigma th$ (W/(m·℃)) | LAYER THICKNESS d (μm) | THERMAL RESISTANCE Rth (℃/W) | TEMPERATURE INCREASE ΔT (℃) (WHEN HEAT GENERATION IS 0.15 W) |
|---|---|---|---|---|
| SAPPHIRE SUBSTRATE | 42 | 100 | 5.64 | 0.85 |
| DIE BONDING PASTE | 0.2 | 5 | 58.28 | 8.74 |
| ANODIZED ALUMINUM LAYER | 67 | 10 | 0.33 | 0.05 |
| ALUMINUM BASE | 236 | 3000 | 2.72 | 0.41 |
| GLASS-BASED INSULATOR LAYER | 2.4 | 100 | 0.89 | 0.13 |
| THERMAL GREASE LAYER | 1 | 50 | 1.04 | 0.16 |
| | | | | |
| SUBTOTAL (SUBSTRATE THERMAL RESISTANCE) | | | 3.9 | 0.6 |
| TOTAL (TOTAL THERMAL RESISTANCE) | | | 68.9 | 10.3 |

SUBSTRATE (ANODIZED ALUMINUM LAYER, ALUMINUM BASE, GLASS-BASED INSULATOR LAYER → SUBTOTAL)

FIG. 7

NEW LAYER STRUCTURE

| | | THERMAL CONDUCTIVITY $\sigma$th (W/(m·°C)) | LAYER THICKNESS d ($\mu$m) | THERMAL RESISTANCE Rth (°C/W) | TEMPERATURE INCREASE $\Delta$T (°C) (WHEN HEAT GENERATION IS 0.15 W) |
|---|---|---|---|---|---|
| | SAPPHIRE SUBSTRATE | 42 | 100 | 5.64 | 0.85 |
| | DIE BONDING PASTE | 0.2 | 5 | 58.28 | 8.74 |
| SUBSTRATE | GLASS-BASED INSULATOR LAYER | 2.4 | 100 | 73.41 | 11.01 |
| SUBSTRATE | ALUMINUM BASE | 236 | 3000 | 2.15 | 0.32 |
| SUBSTRATE | ANODIZED ALUMINUM LAYER | 67 | 10 | 0.00 | 0.00 |
| | THERMAL GREASE LAYER | 1 | 50 | 1.04 | 0.16 |
| | | | | | |
| | SUBTOTAL (SUBSTRATE THERMAL RESISTANCE) | | | 75.6 | 11.3 |
| | TOTAL (TOTAL THERMAL RESISTANCE) | | | 140.5 | 21.1 |

FIG. 14

DISTANCE BETWEEN LIGHT-EMITTING ELEMENTS $W_0$ = 650 μm
LAYER STRUCTURE

| | | THERMAL CONDUCTIVITY σth (W/(m·℃)) | LAYER THICKNESS d (μm) | THERMAL RESISTANCE Rth (℃/W) | TEMPERATURE INCREASE ΔT (℃) (WHEN HEAT GENERATION IS 0.15 W) |
|---|---|---|---|---|---|
| | SAPPHIRE SUBSTRATE | 42 | 100 | 5.64 | 0.85 |
| | DIE BONDING PASTE | 0.2 | 5 | 58.28 | 8.74 |
| SUBSTRATE | ANODIZED ALUMINUM LAYER | 2.4 | 10 | 0.33 | 0.05 |
| SUBSTRATE | ALUMINUM BASE (UPPER LAYER) | 236 | 310 | 1.49 | 0.22 |
| SUBSTRATE | ALUMINUM BASE (LOWER LAYER) | 236 | 2690 | 6.74 | 1.01 |
| SUBSTRATE | GLASS-BASED INSULATOR LAYER | 67 | 100 | 24.65 | 3.70 |
| | THERMAL GREASE LAYER | 1 | 50 | 29.59 | 4.44 |
| | | | | | |
| SUBSTRATE → | SUBTOTAL (SUBSTRATE THERMAL RESISTANCE) | | | 33.2 | 5.0 |
| | TOTAL (TOTAL THERMAL RESISTANCE) | | | 126.7 | 19.0 |

1:LIGHT-EMITTING DEVICE
16:HEAT SINK

2d: SUBSTRATE
11: GLASS-BASED INSULATOR LAYER
12: ANODIZED ALUMINUM LAYER
13: GLASS-BASED INSULATOR LAYER/CERAMIC INSULATOR LAYER
14: ALUMINUM BASE

LIGHT-EMITTING DEVICE SUBSTRATE, LIGHT-EMITTING DEVICE, AND METHOD FOR PRODUCING LIGHT-EMITTING DEVICE SUBSTRATE

TECHNICAL FIELD

The present invention relates to a light-emitting device substrate, to a light-emitting device that uses the light-emitting device substrate, and to a production method for producing the light-emitting device substrate.

BACKGROUND ART

Basic performance properties necessary for light-emitting device substrates include high reflectivity, high heat dissipation capability, high dielectric voltage, and long-term reliability.

Representative examples of such light-emitting device substrates include those using ceramic substrates. Such a light-emitting device substrate is produced by forming an electrode pattern on a plate-shaped ceramic substrate. With the trend toward high power light-emitting devices, an improvement in brightness is achieved by arranging a large number of light-emitting elements. This has led to a steady increase in size of ceramic substrates year by year.

Specifically, when a general LED light-emitting device used with an input power of 30 W is realized by, for example, arranging blue LED elements with dimensions of around 650 μm×650 μm on one substrate classified as a medium size substrate, about 100 LED elements are necessary. One example of the ceramic substrate on which about 100 LED elements are arranged is a ceramic substrate having a thickness of about 1 mm and a plane size of 20 mm×20 mm or larger.

To realize a brighter light-emitting device for LED lighting with an input power of 100 W or more on the basis of technical development regarding upsizing of substrates, there is a need for a larger-size ceramic substrate with a plane size of 40 mm×40 mm or larger on which 400 or more LED elements can be placed at once.

However, implementation of large-size ceramic substrates on a commercial basis in response to the need for the large-size ceramic substrates described above has been difficult because of the following three issues: the strength, production accuracy, and production cost of the substrates.

A ceramic material is basically pottery, and one problem with a large ceramic substrate is its strength. When the substrate is increased in thickness in order to overcome the above problem, its thermal resistance becomes high (its heat dissipation capability deteriorates), and a new problem arises in that the material cost of the substrate increases. When a ceramic substrate is increased in size, not only the outer dimensions of the substrate but also the dimensions of an electrode pattern formed on the substrate tend to lose their accuracy. This results in a problem in that a reduction in production yield and an increase in production cost of the substrate tend to occur.

To overcome the foregoing problems with upsizing of ceramic substrates, PTL 1 to PTL 4, for example, propose light-emitting device substrates in which a ceramic-based paint is used to form a light reflecting layer on a surface of a metal base. These light-emitting device substrates have excellent reflectivity and dielectric voltage, and therefore good light-emitting device substrates can be realized.

CITATION LIST

Patent Literature

PTL 1: Japanese Unexamined Patent Application Publication No. 59-149958 (published on Aug. 28, 1984)

PTL 2: Japanese Unexamined Patent Application Publication No. 2012-102007 (published on May 31, 2012)

PTL 3: Japanese Unexamined Patent Application Publication No. 2012-69749, (published on Apr. 5, 2012)

PTL 4: Japanese Unexamined Patent Application Publication No. 2006-332382, (published on Dec. 7, 2006)

SUMMARY OF INVENTION

Technical Problem

The light-emitting device substrate having the light reflecting layer formed on the surface of the metal base using the ceramic-based paint has excellent reflectivity and dielectric voltage. However, this light-emitting device substrate has a problem in that its thermal resistance is high and heat dissipation capability is low.

Many attempts have been made to improve the heat dissipation capability. However, with conventional substrate layer structures and conventional substrate production methods, the heat dissipation capability can no longer be improved because of the reason described below.

In a light-emitting device substrate in which a light reflecting layer is formed on a surface of a metal base using a ceramic-based paint, high reflectivity and high dielectric voltage are achieved simultaneously by coating the light-emitting element-mounted side of the metal base with a high-reflectivity thin film layer formed of the ceramic. However, this is one reason that the heat dissipation capability cannot be improved.

Generally, the ceramic layer is formed on the metal base by sintering ceramic particles using, as a binder, a material having a lower thermal conductivity than the ceramic, and therefore the thermal conductivity of the ceramic layer is lower by about one to two orders of magnitude than that of the pure ceramic. To compensate for the low thermal conductivity to thereby improve the heat dissipation capability of the ceramic layer, the thickness of the ceramic layer is reduced as much as possible, specifically to about 50 μm to about 100 μm, to thereby reduce the thermal resistance. To further improve the heat dissipation capability, it is necessary to further reduce the thickness of the ceramic layer. However, if the thickness of the ceramic layer is excessively small, its function as the light reflecting layer deteriorates, and also the dielectric voltage comes into question.

Specifically, if the thickness is, for example, less than about 50 μm to about 100 μm, it is difficult for the substrate to have a dielectric withstand capability exceeding 5 kV, which is necessary for lighting devices etc. Therefore, a thickness of about 50 μm to about 100 μm is the lower limit thickness for allowing the ceramic layer to have heat dissipation capability and a dielectric withstand capability exceeding 5 kV simultaneously.

To achieve a further increase in output power, improvement in heat dissipation capability is indispensable for high-power light-emitting devices. For example, in a high-power light-emitting device, such as a light-emitting device for lighting, obtained by integrating a large number of light-emitting elements on a single substrate, improvement in heat dissipation capability results in a reduction in the temperature of an active layer of each light-emitting element. This results in an improvement in long-term reliability under the same input power, so that the service life of the device is extended. When the heat dissipation capability is improved, the upper limit of the input power per element can be increased, and this allows an improvement in the output power of the light-emitting device without changing the number of light-emitting elements integrated on the single substrate.

In the conventional structure, the high-reflectivity ceramic-made thin-film layer formed on the metal base and provided in order to achieve high reflectivity, high heat dissipation capability, high dielectric voltage, and long-term reliability acts rather as a hindrance in consideration of a further improvement in the heat dissipation capability of the substrate and a further improvement in the efficiency of the light-emitting device.

As described above, the conventional light-emitting device substrates use metal bases. However, there is no conventional substrate having low thermal resistance, excellent in heat dissipation capability, and also having excellent reflectivity and excellent dielectric withstand capability.

The present invention has been made in view of the foregoing problems in the related art, and it is an object to provide a light-emitting device substrate having high reflectivity, high heat dissipation capability, dielectric withstand capability, and long-term reliability and excellent in mass productivity and to provide a light-emitting device using the light-emitting device substrate and a method for producing the light-emitting device substrate.

Solution to Problem

To achieve the above object, the light-emitting device substrate of the present invention is a light-emitting device substrate comprising a base formed of aluminum, wherein a light reflecting surface covered with an anodized aluminum coating is formed on one side of the base, wherein, on the one side of the base, a first insulating layer and an electrode pattern disposed on the first insulating layer are formed in a region other than the light reflecting surface, the first insulating layer covering exposed portions of the base other than portions covered by the anodized aluminum coating, and wherein a second insulating layer is formed at least on the other side of the base that is opposite the one side of the base.

To achieve the above object, the light-emitting device substrate production method of the present invention is a method for producing a light-emitting device substrate including a base formed of aluminum, the method comprising the steps of: (a) forming a light reflecting surface on one side of the base by subjecting the one side of the base to anodic oxidation, which is covered with an anodized aluminum coating; (b) forming a first insulating layer on the one side of the base in a region other than the light reflecting surface; forming a conductive layer on the first insulating layer; (c) forming an electrode pattern on the conductive layer; and (d) forming a second insulating layer at least on the other side of the base that is opposite the one side of the base, the step (a) being carried out after the step (b).

In the above-described configuration and method, the base used is formed of aluminum, and the anodic oxidation of the base allows the formation of the light reflecting surface covered with the anodized aluminum coating.

The anodized aluminum coating formed on the one side of the base is extremely stable to light and heat, and the light reflecting surface covered with the anodized aluminum coating does not undergo discoloration and can stably maintain high light reflectivity. The use of the anodized aluminum coating can improve long-term reliability. The anodized aluminum coating is excellent in mass productivity.

The second insulating layer formed on the other side of the base that is opposite the one side of the base can ensure high heat dissipation capability and dielectric withstand capability.

As described above, in the light-emitting device substrate described above, the one side of the base on which the anodized aluminum coating is formed functions as the light reflecting surface, and the other side of the base that is opposite the one side of the base ensures high heat dissipation capability and dielectric withstand capability.

The first insulating layer is formed on the base in a region other than the light reflecting surface, and the first insulating layer covering exposed portions of the base other than portions covered by the anodized aluminum coating. Therefore, the first insulating layer is not easily delaminated. The first insulating layer provided can prevent a short circuit between the base and the electrode pattern.

Advantageous Effects of Invention

The light-emitting device substrate of the present invention, a light-emitting device using this light-emitting device substrate, and a method for producing this light-emitting device substrate can provide a light-emitting device substrate having high reflectivity, high heat dissipation capability, dielectric withstand capability, and long-term reliability and excellent in mass productivity and can provide a light-emitting device using this light-emitting device substrate and a method for producing this light-emitting device substrate.

BRIEF DESCRIPTION OF DRAWINGS

FIG. 5 is a table showing the thermal conductivity σth, layer thickness d, thermal resistance Rth, and temperature increase ΔT of each of the layers shown in FIG. 4.

FIG. 7 is a table showing the thermal conductivity σth, layer thickness d, thermal resistance Rth, and temperature increase ΔT of each of the layers shown in FIG. 6.

FIG. 14 is a table showing the thermal resistance Rth and temperature increase ΔT of each layer determined from the thermal conductivity σth and layer thickness d of each layer based on the model structure shown in FIG. 13.

DESCRIPTION OF EMBODIMENTS

Embodiments of the present invention will next be described in detail with reference to the drawings. However, the dimensions, materials, shapes, relative arrangement, etc., of components described in these embodiments are merely embodiments, and it should not be construed that the scope of the invention is limited by the embodiments.

The embodiments of the present invention will be described with reference to FIGS. 1 to 29 as follows.

Embodiment 1

One embodiment of the present invention will be described with reference to FIGS. 1 to 19, 28, and 29 as follows.

(Light-Emitting Device)

Figure 1:
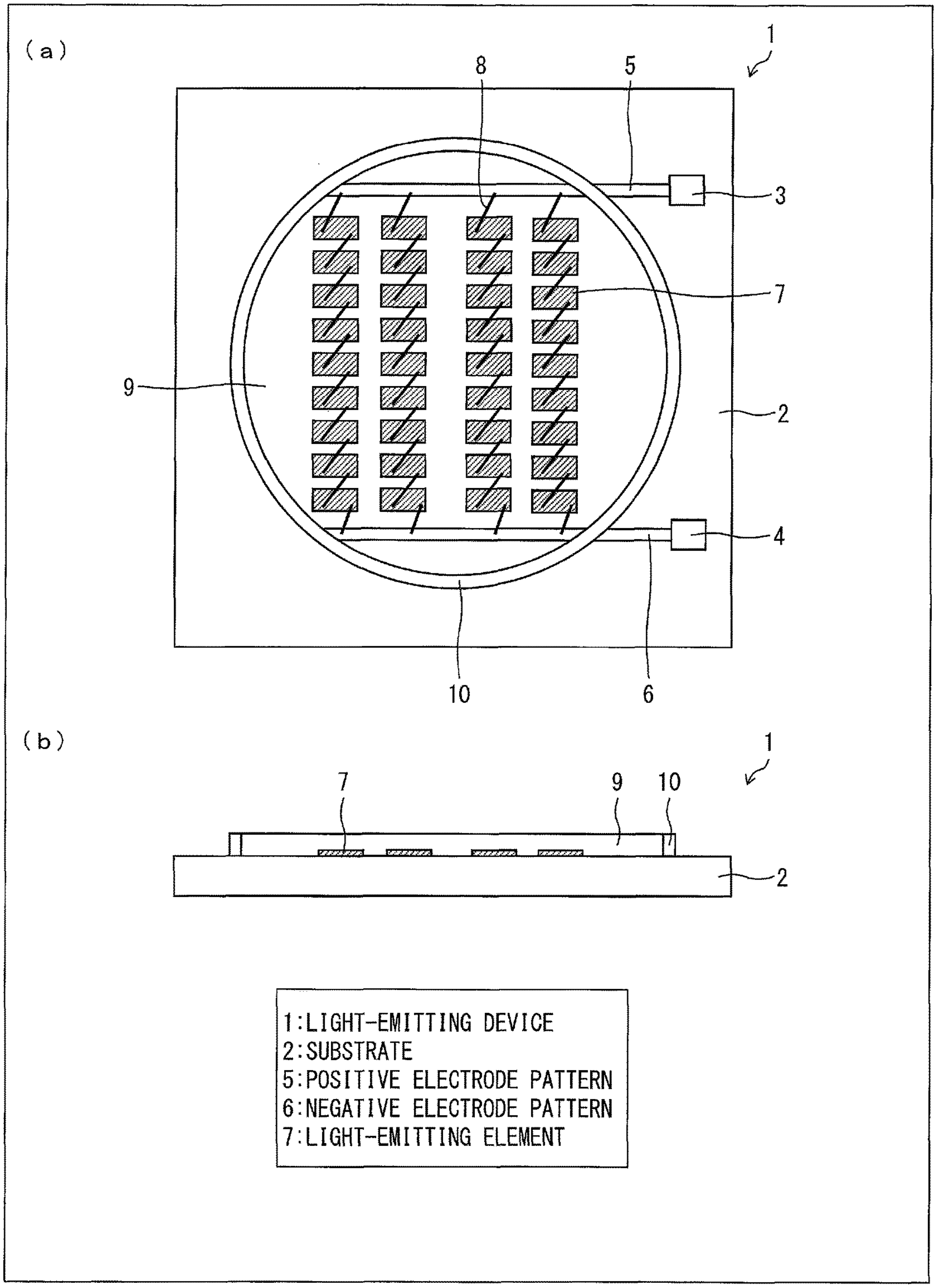
FIG. 1 shows illustrations of a schematic structure of a light-emitting device in embodiment 1.

FIG. 1 shows a schematic structure of a light-emitting device 1 in the present embodiment. FIG. 1(*a*) is a plan view of the light-emitting device 1, and FIG. 1(*b*) is a cross-sectional view of the light-emitting device 1.

As illustrated, the light-emitting device 1 is a COB (chip on board) type light-emitting device in which a plurality of light-emitting elements 7 are mounted on a light-emitting device substrate 2.

In the present embodiment, light-emitting diodes (hereinafter referred to as LED elements) are used as the light-emitting elements 7. However, this is not a limitation, and EL elements, for example, may be used.

A sealing resin-surrounding frame 10 that surrounds the plurality of light-emitting elements 7 is disposed on the light-emitting device substrate 2, and the inside of the sealing resin-surrounding frame 10 is filled with a sealing resin 9 to seal the light-emitting elements 7. The sealing resin 9 contains a phosphor that is excited by light emitted from the light-emitting elements 7 and converts the light to light with a different wavelength, and the light-emitting device 1 emits light from the surface of the sealing resin 9.

The detailed structure of the light-emitting device substrate 2 will be described later using FIGS. 2 and 3, and therefore the detailed structure of the light-emitting device substrate 2 is omitted in FIG. 1. To simplify the figures, the number of light-emitting elements 7 on the light-emitting device substrate 2 is reduced significantly in the illustrations. Also in figures other that FIG. 1, dimensions are appropriately adjusted for convenience of explanation. Therefore, the dimensions do not necessarily indicate the actual numbers and the actual similarity relations.

When the degree of integration of the light-emitting elements 7 in the light-emitting device 1 is increased, the input power increases to 10 W, 50 W, 100 W, or 100 W or more, and emission of high-intensity light is obtained.

In the present embodiment, the light-emitting elements 7 used are medium size LED elements of about 650 μm×650 μm. To achieve a high-power light-emitting device 1 with an input power of about 100 W by integrating such light-emitting elements 7, it is necessary to integrate a large number, e.g., about 300 to about 400, of light-emitting elements 7.

In the present embodiment, since the sealing resin 9 contains the phosphor, the light-emitting elements 7 used may be blue LED elements, purple LED elements, UV LED elements, etc., and the phosphor used may be one of blue, green, yellow, orange, and red phosphors or any combination of a plurality of different color phosphors. This allows light with a desired color to be emitted.

In the above example in the present embodiment, the sealing resin 9 contains the phosphor, but this is not a limitation. The sealing resin 9 may contain no phosphor, and light-emitting elements 7 of three colors, i.e., blue, green, and red colors, with different light emission wavelengths may be arranged on the light-emitting device substrate 2, or light-emitting elements 7 of two different colors may be arranged on the light-emitting device substrate 2. Alternatively, single-color light-emitting elements 7 may be arranged on the light-emitting device substrate 2.

As shown in FIG. 1, a positive electrode connector 3 and a negative electrode connector 4 that are to be connected to an external power source are disposed on the light-emitting device substrate 2. In addition, a positive electrode pattern 5 electrically connected to the positive electrode connector 3 and a negative electrode pattern 6 electrically connected to the negative electrode connector 4 are disposed on the light-emitting device substrate 2.

The light-emitting device 1 is of the high-intensity type with brightness requirements and has a structure in which the plurality of light-emitting elements 7 are connected in series through wires 8 and a high voltage is supplied to the light-emitting elements 7 through wires 8 at their opposite ends to emit light. However, the manner of connection of the light-emitting elements 7 etc. are not limited to those described above.

(Light-Emitting Device Substrate)

The light-emitting device substrate 2 used for the light-emitting device 1 will next be described with reference to FIG. 2.

Figure 2:
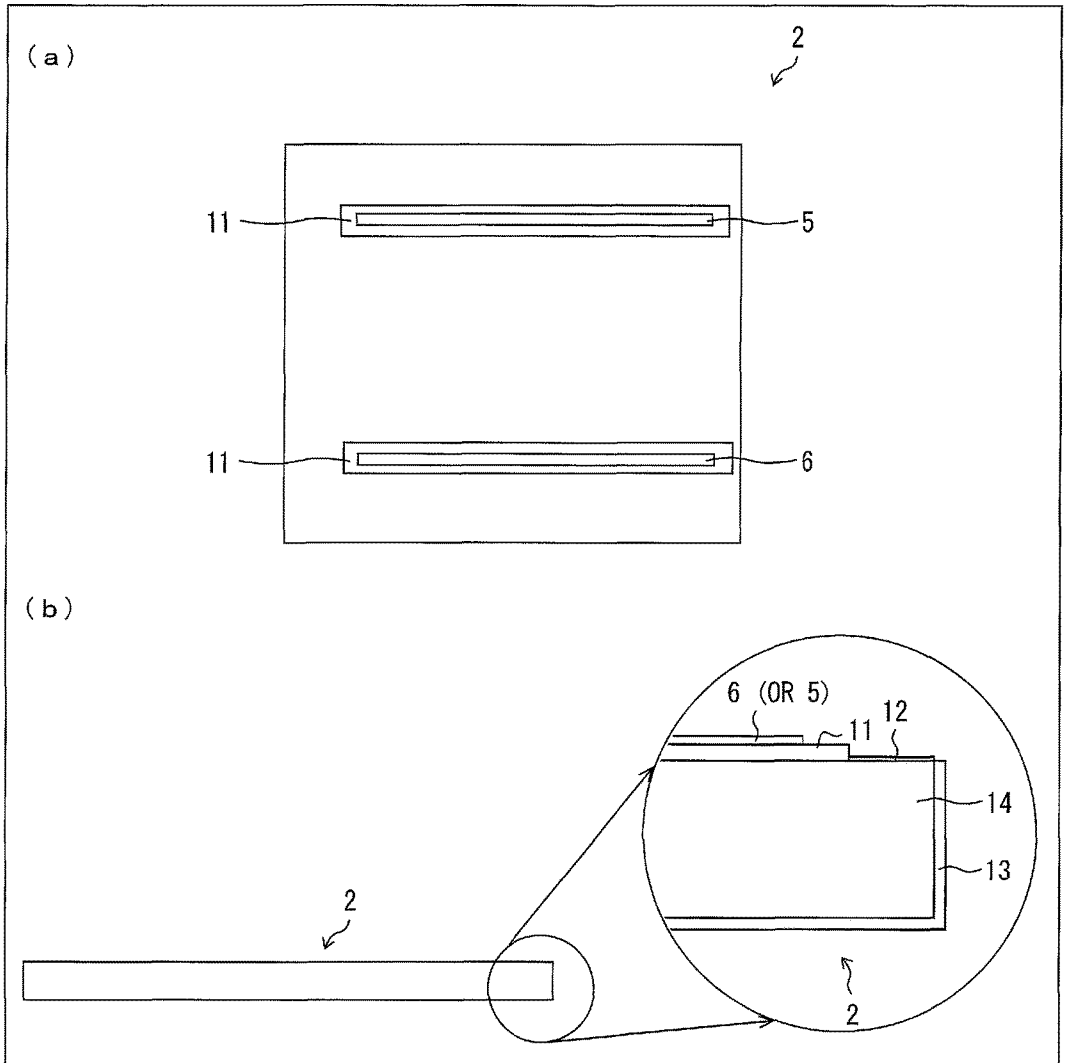
FIG. 2 shows illustrations of a light-emitting device substrate used for the light-emitting device in embodiment 1.

FIG. 2 shows illustrations of the light-emitting device substrate 2. FIG. 2(*a*) is a plan view of the light-emitting device substrate 2, and FIG. 2(*b*) is a partial enlarged view of a cross section of the light-emitting device substrate 2.

As illustrated, the light-emitting device substrate 2 includes an aluminum base 14. Although the aluminum base 14 is used in the present embodiment, this is not a limitation. Any base containing aluminum as a main component can be used.

In the present embodiment, the aluminum base 14 used has a longitudinal width of 50 mm, a traverse width of 50 mm, and a thickness of 3 mm, but the dimensions of the aluminum base 14 are not limited thereto. The dimensions may be appropriately determined in consideration of the size of the light-emitting elements 7, the degree of integration of the light-emitting elements 7, etc.

In the present embodiment, the aluminum base 14 used is a base formed of aluminum, but this is not a limitation. A base containing an aluminum component in such an amount that the aluminum can undergo anodic oxidation, i.e., an aluminum base containing another component in such an amount that the anodic oxidation of the aluminum is not impeded, may be used.

As shown in FIG. 2(*b*), a glass-based insulator layer 11 (a first insulating layer) and a high-reflectivity light reflecting layer covered with an anodized aluminum layer 12 are disposed on one side of the aluminum base 14. A glass-based insulator layer 13 is disposed at least on the other side of the aluminum base 14 (the rear side of the aluminum base 14 opposite the side on which the anodized aluminum layer 12 is formed). In the present embodiment, the glass-based insulator layer 13 is disposed also on the side surfaces of the aluminum base 14.

The glass-based insulator layer 11, a base circuit pattern (not shown in FIG. 2) formed on the glass-based insulator layer 11 and composed of a conductive layer, and the negative electrode pattern 6 (or the positive electrode pattern 5) that covers the base circuit pattern composed of the conductive layer are formed on the one side of the aluminum base 14.

The glass-based insulator layer 11 is an insulator layer provided in order to prevent a short circuit between the aluminum base 14 and the negative electrode pattern 6 (or the positive electrode pattern 5).

In the present embodiment, the glass-based insulator layer 11 and the glass-based insulator layer 13 are insulator layers prepared by coating ceramic particles formed of aluminum nitride with a glassy material in order to reduce thermal resistance, but this is not a limitation.

For example, a ceramic insulator layer may be used instead of the glass-based insulator layer 13. In this case, since it is impossible to sinter the ceramic layer at high temperature on a low-melting point base such as the aluminum base, ceramic particles are injected onto the aluminum base 14 at high speed to deposit the ceramic layer. Specific examples of the method of injecting the ceramic particles onto the aluminum base 14 include production methods such as a thermal spraying method and an AD method (an aerosol deposition method). The temperature of the base during deposition of the ceramic layer is low in the above methods. Specifically, the temperature of the base is at most about 200° C. in the thermal spraying method and is around room temperature in the AD method. With these production methods, a ceramic layer can be easily formed on a low-melting point metal such as aluminum.

In the present embodiment, the first insulating layer formed on the one side of the aluminum base 14 is the glass-based insulator layer 11, but this is not a limitation. The first insulating layer used may be an anodized aluminum layer composed of an anodic oxide coating produced by subjecting the aluminum base 14 to aluminum anodization (anodic oxidation). No particular limitation is imposed on the thickness of the anodized aluminum layer in this case, so long as the anodized aluminum layer has a thickness necessary to prevent a short circuit between the aluminum base 14 and the negative electrode pattern 6 (or the positive electrode pattern 5).

(Process for Producing Light-Emitting Device Substrate)

A process for producing the light-emitting device substrate 2 shown in FIG. 2 will be described with reference to FIG. 3.

Figure 3:
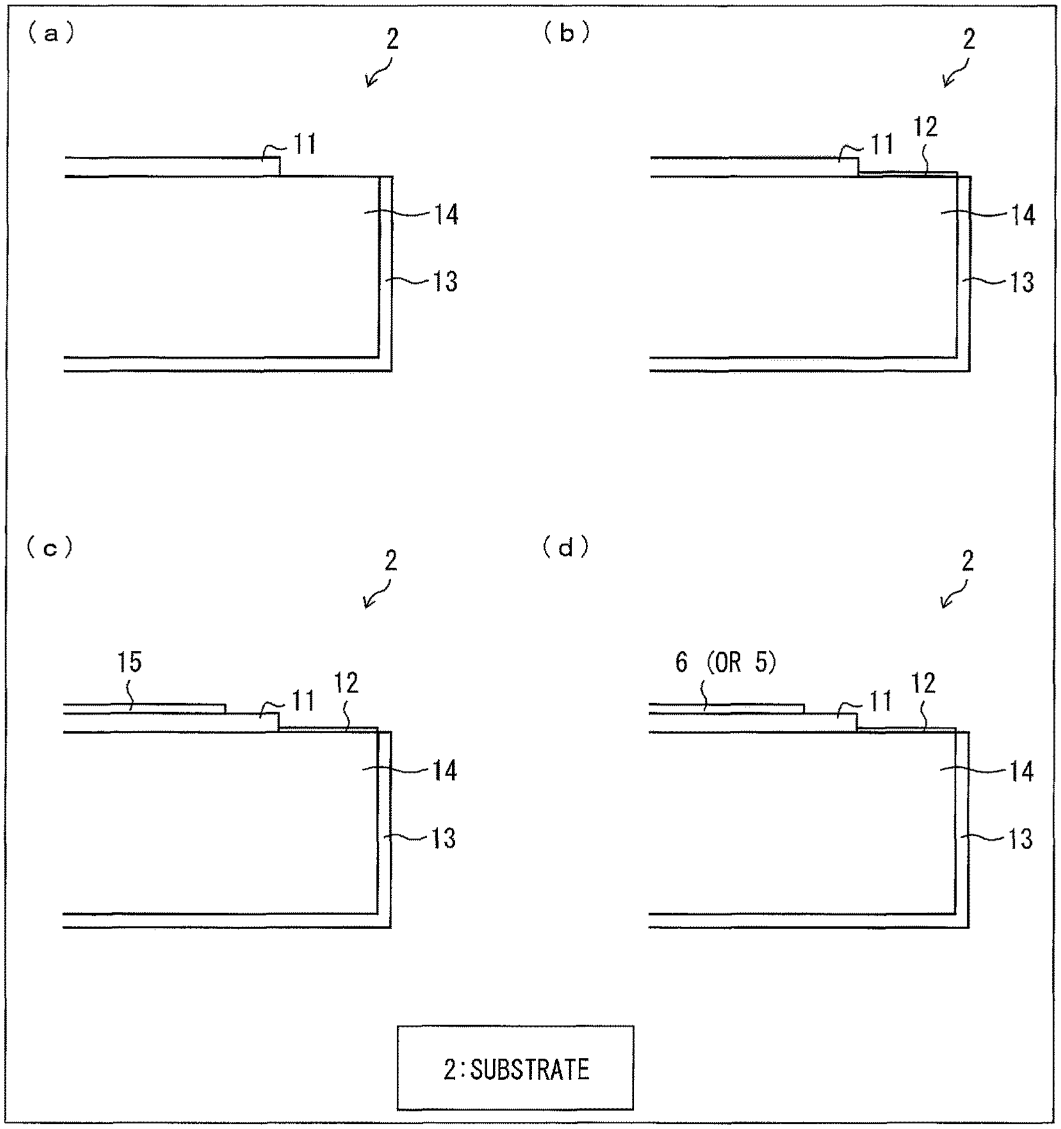
FIG. 3 shows illustrations for explaining a process for producing the light-emitting device substrate shown in FIG. 2.

FIG. 3 shows illustrations for explaining the process for producing the light-emitting device substrate 2 shown in FIG. 2.

As shown in FIG. 3(*a*), an aluminum base 14 having a longitudinal width of 50 mm and a traverse width of 50 mm is first cut from an aluminum plate having a thickness of 3 mm. A glass-based insulator layer 11, which is an insulator layer including ceramic particles of aluminum nitride coated with a glassy material, is provided on one side of the aluminum base 14, in order to prevent a short circuit between the aluminum base 14 and the negative electrode pattern 6 (or the positive electrode pattern 5) not shown in FIG. 3(*a*).

A glass-based insulator layer 13, which is an insulator layer including ceramic particles of aluminum nitride coated with a glassy material, is provided also on the other side of the aluminum base 14 (the rear side of the aluminum base 14 that is opposite the side on which an anodized aluminum layer 12 is to be formed). In the structure used in the present embodiment, the side surfaces of the aluminum base 14 are covered with the glass-based insulator layer 13, but this is not a limitation. The side surfaces of the aluminum base 14 may be covered with an anodized aluminum layer 12 instead of the glass-based insulator layer 13.

Specifically, in the present embodiment, aluminum-exposed portions of the aluminum base 14 other than portions to be covered with the anodized aluminum layer 12 are covered with the glass-based insulator layer 11 or the glass-based insulator layer 13.

In the present embodiment, the material of the glass-based insulator layer 11 is the same as the material of the glass-based insulator layer 13, but this is not a limitation. The material of the glass-based insulator layer 11 may be different from the material of the glass-based insulator layer 13.

No particular limitation is imposed on the thickness of the glass-based insulator layer 11, so long as the glass-based insulator layer 11 has a thickness necessary to prevent a short circuit between the aluminum base 14 and the negative electrode pattern 6 (or the positive electrode pattern 5). Preferably, the thickness is about 50 μm or more.

Preferably, the thickness of the glass-based insulator layer 13 is about 50 μm to about 150 μm, in consideration of the dielectric withstand capability and heat dissipation capability of the light-emitting device substrate 2. When the thickness of the glass-based insulator layer 13 is 50 μm or more, a dielectric withstand capability of at least 5 kV or more can be ensured.

To form the glass-based insulator layer 11 and the glass-based insulator layer 13 shown in FIG. 3(*a*), for example, a raw material of the glass-based insulator layer 11 and a raw material of the glass-based insulator layer 13 are applied to the aluminum base 14 and then fired.

In the present embodiment, a ceramic paint containing a glass raw material and ceramic particles of aluminum nitride fired at high temperature is used as the raw material of the glass-based insulator layer 11 and the raw material of the glass-based insulator layer 13. The ceramic paint is applied to or printed on the aluminum base 14, and then glass is synthesized from the glass raw material by a sol-gel process to thereby form the glass-based insulator layer 11 and the glass-based insulator layer 13 that are insulator layers including the ceramic particles of aluminum nitride coated with the glassy material.

When the glass-based insulator layer 11 and the glass-based insulator layer 13 are formed using the method including synthesizing the glass from the glass raw material by the sol-gel process as described above, the glass-based insulator layer 11 and the glass-based insulator layer 13 that are ceramic layers formed using the glass-based binder can be formed by a heat treatment process at a relatively low temperature, i.e., 250° C. to 500° C.

For example, the firing temperature of a ceramic raw material including aluminum nitride is generally high, i.e., 1,200° C. to 1,400° C. When a ceramic paint in which a ceramic fired at high temperature and then granulated is contained in an ordinary glass-based binder is fired, it is necessary that the ceramic paint be heat-treated at a considerably high firing temperature of about 900° C. in order to cause the ordinary glass-based binder to experience a high-temperature molten state.

Since the melting point of aluminum in the aluminum base 14 used in the present embodiment is about 660° C., the aluminum base 14 cannot withstand such a high-temperature process.

For this reason, the present embodiment uses the method in which the glassy material is synthesized directly from the glass raw material by the sol-gel process without experiencing a high-temperature molten state. The use of this method allows the glass-based insulator layers 11 and 13 formed as the ceramic layers using the glass-based binder to be formed even using a heat treatment process at a process temperature of 250° C. to 500° C. which is lower than the melting point of aluminum, i.e., about 660° C.

As described above, the use of the method including synthesizing the glass from the glass raw material by the sol-gel process makes it possible to use aluminum as the material of the base of the light-emitting device substrate 2.

In the present embodiment, the particles of aluminum nitride are mixed as the ceramic in order to improve the thermal conductivity of the glass-based insulator layers, but this is not a limitation. The ceramic mixed may be particles containing at least one of aluminum nitride, alumina, zirconia, and titanium oxide.

Separately, silica ($SiO_2$) particles may be mixed into the glass-based binder and used to form the glass-based insulator layers, for the purpose of stabilizing the layer quality and reinforcing the layers. In this case, ceramic particles may be further mixed.

In the present embodiment, the raw material of the glass-based insulator layers includes the sol-like glass raw material serving as the binder for the ceramic. The glass component generated by drying and gelation is then subjected to firing. This allows the glass component to have heat resistance and dielectric withstand capability, as does the ceramic. Therefore, the glass component is used preferably as an insulating material for the light-emitting device substrate. Particularly, when the input power of the light-emitting device is 10 W to 100 W or even higher, the light-emitting device substrate is heated to high temperature because of the heat generated by the light-emitting elements. Therefore, it is preferable that a stable material such as glass is used as the insulating material for the light-emitting device substrate. Also in this case, silica ($SiO_2$) particles, which are a glass component, may be added to the glass-based binder used as the sol-like glass raw material.

The ceramic described above is preferably a ceramic that does not impair the dielectric withstand capability of the glass raw material but reduces thermal resistance.

When a portion covered with the glass-based insulator layer is spaced apart from the light reflecting surface, the light absorption properties of the ceramic mixed are not particularly specified. For example, black particles such as silicon carbide (SiC) particles or silicon nitride ($Si_3N_4$) particles may be used.

The ceramic is not limited to a metal oxide. The ceramic may be more general inorganic solid materials other than metal oxides such as aluminum nitride, silicon carbide, and silicon nitride, so long as it is a stable inorganic solid material that does not impair the dielectric withstand capability of the above glass raw material but reduces thermal resistance.

Of course, each of the glass-based insulator layers may be a film formed only of a glassy material with no ceramic particles mixed therein. In this case, the glassy material film may further contain glassy silica ($SiO_2$) particles.

The ceramic particles and also the silica ($SiO_2$) particles may be embedded in the glass-based insulator layers.

(Glass Binder (Glassy Material) in Glass-Based Insulator Layers)

A description will be given of the glass binder (glassy material), i.e., the glass binder (glassy material) formed by the sol-gel process, in each of the glass-based insulator layers disposed in the light-emitting device substrate in the present embodiment.

For example, a precursor such as an organic polysiloxane that forms a glassy material is used as a raw material in sol form, and a chemical reaction is allowed to proceed at a temperature of 250° C. to 400° C. (500° C.). The precursor is thereby converted directly to a glassy material without experiencing a molten state, and a glass-based insulator layer can thereby be formed.

When the raw material in sol form is dried at relatively low temperature, the raw material undergoes condensation polymerization, forms a three-dimensional network, and is converted to a gel to thereby form a glassy material. In this state, the glassy material is porous, and the strength of the film formed is low. Therefore, the glassy material is subjected to, for example, high-temperature treatment (firing) at 400° C. to 500° C. As a result of the firing, pores in the gel disappear, so that a dense glass-based insulator layer can be formed.

Examples of the raw material of the glass binder (glassy material) used in the present embodiment and formed by the sol-gel process include a sol-like material obtained by hydrolysis and condensation polymerization of a metal alkoxide such as tetraethoxysilane ($Si(OCH_2CH_3)_4$). Other examples include similar sol-like materials such as organic polysiloxanes and condensation products thereof.

A mixture of obtained by mixing the ceramic particles into the above sol-like material is applied to or printed on the base, then dried slowly at about 250° C. to about 400° C. (500° C.), and sintered, whereby the above-described glass-based insulator layer including the sintered body can be obtained.

The sol-like material may have an alkoxyl group typified by an ethoxy group or a methoxy group. For example, when the organic polysiloxane used has an ethoxy group, an acid catalyst is used, and a higher temperature is used. In this case, the condensation reaction proceeds appropriately, and a three-dimensional network structure is formed, whereby the sol-like material is gelated. Then the gelated product is fired, and pores remaining in the gel disappear. A dense and stable glass-based insulator layer is thereby obtained.

The drying-sintering temperature is relatively low, i.e., about 250° C. to about 400° C. (500° C.). To facilitate the reaction, an appropriate amount of a metal oxide or a metal hydroxide may be mixed to lower the softening point and melting point of the glass. To mix an oxide etc., a method widely used for ordinary glass production other than the sol-gel process may be used. Representative examples of the metal oxide added include boron oxide used for borosilicate glass, sodium oxide, and aluminum oxide. A hydroxide containing boron, sodium, aluminum, etc. may be added.

As described above, particles of silica ($SiO_2$) which is a stable glassy material may be added to the sol-like material (the sol-like binder) before firing, for the purpose of obtaining a stable glass-based insulator layer. In this case, the raw material already contains the glassy material. The ordinary silica particles are stable. Therefore, it can be judged that, although the stable silica particles (glassy material) is encapsulated with the newly formed glassy material, it is difficult for the stable silica particles (glassy material) to form new chemical bonds with the newly formed glassy material. When the stable silica particles (glassy material) are added, the silica particles are considered to be surrounded by the glass binder, as are the ceramic particles.

A glass binder (glassy material) may be formed using an ordinary method other than the sol-gel process. However, since the ordinary method includes a heat treatment step at relatively high temperature (firing temperature: about 900° C.), this method cannot be used when a glass-based insulator layer is formed on a base formed of aluminum. A base containing aluminum in such an amount that the aluminum can undergo anodic oxidation (an aluminum base containing other components in such an amount that the anodic oxidation of the aluminum is not hindered) may be used. When the melting point of this base is high and the base can withstand the above-described heat treatment step at relatively high temperature, the above-described ordinary method can be used to form a glass binder (glassy material).

The raw material used for the above ordinary method is different from the raw material used for the sol-gel process described above and contains glass particles before printing on the base.

The glass particles in the raw material are re-melted by firing and then cured to thereby obtain a dense and smooth glass-based insulator layer on the base. A description will next be given of the formation of the glass binder (glassy material) on the base using the ordinary method.

First, particles of low-melting point glass produced in a molten state and then pulverized or particles of particulate low-melting point glass (e.g., glass having a melting point of around 800° C.) obtained by vapor phase growth are prepared into a paste using, for example, an organic binder or an organic solvent. Next, the prepared paste is printed on the base and fired at a high temperature of around 800° C. A resin used as the organic binder or the organic solvent is thereby removed by evaporation or combustion, and only the glass particles are re-melted and then cured on the base, whereby a dense and smooth glass-based insulator layer is obtained. When ceramic particles or high-melting point silica particles are mixed into the paste in advance, these particles are embedded in the glass-based insulator layer, and the glassy material re-melted and then cured serves as a binder for these particles.

(Content of Ceramic Particles in Glass-Based Insulator Layers)

In the present embodiment, the ceramic paint containing the ceramic particles and the glass raw material is used as the raw material of the glass-based insulator layers 11 and 13. In this case, the percent by weight of the ceramic particles in each glass-based insulator layer is preferably 50% to 90% after the glass-based insulator layer is completed. The reason for this will next be described.

Generally, ceramic has higher thermal conductivity than glass. When a ceramic encapsulated with a glassy material is used for a glass-based insulator layer, it is necessary to reduce the amount of the glass binder (glassy material) as much as possible and to increase the amount of the ceramic, in order to increase the thermal conductivity of the insulator layer.

One example of the ceramic having high thermal conductivity is aluminum nitride particles used in the present embodiment. In the glass-based insulator layer produced by encapsulating these aluminum nitride particles with the glass binder (glassy material), when the amount of the aluminum nitride particles is 50% by weight or more, the effect of increasing the thermal conductivity becomes significant. The thermal conductivity increases monotonically until the amount of aluminum nitride particles exceeds about 90% by weight in the finally completed glass-based insulator layer.

If the amount of the aluminum nitride particles in the finally formed glass-based insulator layer is 95% by weight or more and the amount of the glass binder (glassy material) is 5% by weight or less, a problem arises in that the adhesion of the glass-based insulator to the base is insufficient and the glass-based insulator layer is easily delaminated. Simultaneously, the adhesion between the aluminum nitride particles is also insufficient.

Therefore, not only the adhesion of the glass-based insulator layer to the base deteriorates, but also the thermal conductivity decreases steeply. For the purpose of improving the thermal conductivity, the percent by weight of the ceramic particles in the glass-based insulator layer is preferably 50% to 90%.

Of course, the glassy material alone with no ceramic mixed may be used for the glass-based insulator layer, as described above. This is because, although the thermal conductivity of the glass-based insulator layer is small, its influence on substrate thermal resistance is generally small so long as the glass-based insulator layer is used on the rear side of the base.

Whether the glassy material alone with no ceramic mixed or a mixture of the glassy material and the ceramic is used for the glass-based insulator layer may be appropriately determined according to the specific use conditions of the substrate.

As described above, the glass-based insulator layer may be formed using a mixture of the glass binder and glass particles such as silica particles, irrespective of whether or not the ceramic is mixed. Since the silica particles themselves are a stable glassy material, the silica particles mixed contribute to the formation of a glass-based insulator layer having stable properties.

As shown in FIG. 3(*b*), an aluminum-exposed portion of the aluminum base 14 other than the portion covered with the glass-based insulator layer 11 and the portion covered with the glass-based insulator layer 13 is covered with the anodized aluminum layer 12.

The light reflecting layer composed of the aluminum base 14 covered with the anodized aluminum layer 12 can prevent corrosion of the aluminum base 14 by oxidation, and therefore high light reflectivity can be maintained for a long time.

When the aluminum base 14 containing aluminum as a main component is used as the base of the light-emitting device substrate 2, the anodized aluminum layer 12 composed of an anodic oxide coating obtained by aluminum anodization (anodic oxidation) of the aluminum base 14 can be formed as shown in FIG. 3(*b*). The anodized aluminum layer 12 formed in the manner described above is very hard and excellent in durability.

Next, the influence of the anodized aluminum layer 12 on the thermal resistance (heat dissipation capability) of the light-emitting device substrate 2 will be examined.

In the present embodiment, the anodized aluminum layer 12 is formed so as to have a relatively small thickness of 5 μm to 10 μm and at most about 30 μm.

The thermal conductivity of the anodized aluminum is about 67 W/(m·K), which is only about ⅓ the thermal conductivity of aluminum, 236 W/(m·K), but is relatively high as compared with the thermal conductivity of glass (about 1 W/(m·K)) and the thermal conductivity of a silicone resin (0.15 to 0.30 W/(m·K)).

In consideration of the thermal conductivity of the anodized aluminum described above and the thickness of the anodized aluminum layer 12, the influence of the anodized aluminum layer 12 on the thermal resistance (heat dissipation capability) of the light-emitting device substrate 2 is very small and negligible.

(Pore Sealing Treatment)

In the present embodiment, pore sealing treatment is performed after the anodic oxidation, i.e., after the formation of the anodized aluminum layer 12, in order to seal the pores in the porous anodized aluminum layer 12 which is the anodic oxide coating.

When the pore sealing treatment is performed after the anodic oxidation as described above, the anodized aluminum layer 12, which is the anodized aluminum coating, is stabilized, and the durability, corrosion resistance, and erosion resistance of the aluminum base 14 are further improved. Therefore, the light reflecting layer composed of the aluminum base 14 covered with the anodized aluminum layer 12 can maintain high light reflectivity for a long time.

The pore sealing treatment may be performed according to any ordinary method in this field, and one representative method is pore sealing treatment in boiling water. Specifically, after the anodic oxide coating is formed, the anodized aluminum layer 12 is washed well with water and is held in heated pure water for about 30 minutes. This method has high working efficiency because a large number of substrates can be treated at once.

This pore sealing treatment may be performed as needed depending on the film state of the formed anodized aluminum layer 12 and is not necessarily performed.

It is preferable to form the anodized aluminum layer 12 by anodic oxidation after the formation of the glass-based insulator layer 11 and the glass-based insulator layer 13 as in the present embodiment because of the following reasons.

As described above, in the step of forming the glass-based insulator layer 11 and the glass-based insulator layer 13, the ceramic paint containing the ceramic particles fired at high temperature and the glass raw material is applied to or printed on the aluminum base 14, and then glass is synthesized from the glass raw material by the sol-gel process to thereby form the glass-based insulator layer 11 and the glass-based insulator layer 13. The firing temperature in this case is lower than the melting point of aluminum, about 660° C., and is 250° C. to 500° C.

However, when the anodized aluminum layer 12 composed of the anodic oxide coating is fired by heating it to the above-described temperature, the anodized aluminum layer 12 is cracked. This causes not only a significant reduction in the function of protecting the aluminum base 14 from a plating solution during plating treatment in the subsequent step of forming electrode patterns but also a reduction in the function as a protective film for preventing oxidation, corrosion, and erosion. In addition, the function as an electrical insulating layer deteriorates.

Moreover, when the anodized aluminum layer 12 is formed by anodic oxidation after the formation of the glass-based insulator layer 11 and the glass-based insulator layer 13, the glass-based insulator layer 11 and the glass-based insulator layer 13 serve as masks during anodic oxidation, and only an exposed portion of the aluminum base 14 that is not covered with the glass-based insulator layer 11 and the glass-based insulator layer 13 is coated with the anodized aluminum layer 12.

There is another reason that it is preferable to form the anodized aluminum layer 12 by anodic oxidation after the formation of the glass-based insulator layer 11 and the glass-based insulator layer 13.

It is difficult to form the glass-based insulator layer 11 and the glass-based insulator layer 13 on the anodized aluminum layer 12. Even if these insulator layers can be formed on the anodized aluminum layer 12, they are easily delaminated.

In the step of forming the anodized aluminum layer 12, the aluminum base 14 is immersed in a chemical solution, and an electric current is applied to the aluminum base 14 to form the anodized aluminum layer 12. Therefore, the entire aluminum-exposed surface of the aluminum base 14 is covered with anodized aluminum. In order to avoid the above delamination problem when the glass-based insulator layer 11 and the glass-based insulator layer 13 are formed after the formation of the anodized aluminum layer 12, it is necessary to perform anodic oxidation partially on the aluminum base 14 to thereby form the anodized aluminum layer 12 only in part of the aluminum base 14. Alternatively, anodic oxidation is performed on the entire aluminum base 14 to form the anodized aluminum layer 12 on the entire aluminum base 14, and then the anodized aluminum layer 12 on regions on which the glass-based insulator layer 11 and the glass-based insulator layer 13 are to be formed is removed.

The above processes are difficult to perform. To actually perform any of these processes, additional wasteful steps are required, and the production process becomes complicated. Therefore, also from the viewpoint of reducing the labor of production to thereby simplify the production process, it is preferable to form the anodized aluminum layer 12 by anodic oxidation after the formation of the glass-based insulator layer 11 and the glass-based insulator layer 13.

In the present embodiment, the glass-based insulator layer 11 and the glass-based insulator layer 13 are formed simultaneously, but this not a limitation. The glass-based insulator layer 11 and the glass-based insulator layer 13 may be formed separately, and any order of formation suitable for the production apparatus used may be selected.

(Step of Polishing Light Reflecting Surface Before Anodic Oxidation to Achieve High Intensity)

In the present embodiment, the step of polishing the surface of the aluminum base 14 is performed before anodic oxidation, in order to improve the reflectivity of the light reflecting surface of the aluminum base 14 covered with the anodized aluminum layer 12.

By polishing the surface of the aluminum base 14 using buffing, chemical polishing, electrolytic polishing, etc. and then performing anodic oxidation, a high intensity reflecting surface having high light reflectivity can be obtained.

In the present embodiment, the aluminum base 14 is buffed and then subjected to electrolytic polishing as finishing polishing. The finishing polishing may be chemical polishing.

Light incident on the light reflecting surface of the aluminum base 14 covered with the anodized aluminum layer 12 is reflected or scattered by the anodized aluminum coating (the anodized aluminum layer 12) or passes through the anodized aluminum layer. The light that passes through the anodized aluminum layer and reaches the aluminum base is reflected or scattered by the upper surface of the aluminum base.

By performing finishing polishing as described in the present embodiment, irregularities on the surface of the aluminum base 14 are removed before anodic oxidation, so that the finished quality of the surface after anodic oxidation can be improved. Specifically, when anodic oxidation is performed after the aluminum base is polished, the smoothness of the upper surface of the aluminum base is improved, and scattering can thereby be suppressed, so that a high reflectivity substrate can be realized. When anodic oxidation is performed after the aluminum base is polished, the smoothness of the anodic oxide coating formed on the upper surface of the aluminum base improved in smoothness is also improved, and light scattering from this layer can also be suppressed, so that a high reflectivity substrate can be realized. Therefore, a high intensity reflecting surface with high light reflectivity can be formed on the light-emitting device substrate 2. In the present embodiment, a combination of buffing and electrolytic polishing is used, but this not a limitation. In the polishing step, at least one of buffing, chemical polishing, and electrolytic polishing can be used.

In the present embodiment, the polishing step is performed before anodic oxidation. However, the polishing step may be performed before the glass-based insulator layer 11 is formed.

In the manner described above, the light-emitting device substrate 2 shown in FIG. 3(*b*) can be realized. In this light-emitting device substrate 2, the aluminum base 14 has the light reflecting surface protected by the anodized aluminum layer 12 and having high light reflectivity, and the aluminum base 14 is covered with the glass-based insulator layer 11 and the glass-based insulator layer 13. The light-emitting device substrate 2 has high light reflectivity, high heat dissipation capability, and high dielectric withstand capability.

(Production of Positive Electrode Pattern and Negative Electrode Pattern)

A description will be given of the procedure of producing the positive electrode pattern 5 and the negative electrode pattern 6 with reference to FIGS. 3(*c*) and 3(*d*).

As shown in FIG. 3(*c*), the glass-based insulator layer 11 is formed on one side of the aluminum base 14 for the purpose of preventing a short circuit between the aluminum base 14 and the positive electrode pattern 5 or the negative electrode pattern 6.

In the present embodiment, in consideration of the fact that the dielectric voltage of the glass-based insulator layer is higher than that of the anodized aluminum layer, the insulator layer used is the glass-based insulator layer 11 for the purpose of preventing a short circuit between the aluminum base 14 and the positive electrode pattern 5 or the negative electrode pattern 6, but this not a limitation. The anodized aluminum layer 12 may be used as the insulator layer instead of the glass-based insulator layer 11 depending on the intended purpose or application of the light-emitting device substrate 2.

When the anodized aluminum layer 12 is used instead of the glass-based insulator layer 11, the insulator layer can be formed so as to be continuous with the anodized aluminum layer 12.

As shown in FIG. 3(*c*), in the present embodiment, a metal paste formed from a resin containing metal particles is used to draw a circuit pattern serving as a base of an electrode pattern on the glass-based insulator layer 11 by, for example, printing, and the circuit pattern is dried to thereby form a base circuit pattern 15.

Since the surface of the base circuit pattern 15 is thinly coated with the resin (a resin coating layer), no plating will be deposited on the surface of the base circuit pattern 15 when the surface remains coated with the resin. Therefore, the resin on the surface of the base circuit pattern 15 is removed by etching (removal of the resin coating layer) to expose a conductive layer of the base circuit pattern 15.

As shown in FIG. 3(*d*), plating treatment is performed after the conductive layer of the base circuit pattern 15 is exposed, and an electrode-forming metal is thereby deposited on the base circuit pattern 15 to complete the positive electrode pattern 5 or the negative electrode pattern 6.

Since the entire aluminum base 14 has already been covered with the anodized aluminum layer 12, the glass-based insulator layer 11, and the glass-based insulator layer 13, the aluminum base 14 is not eroded by the plating solution used in the plating treatment step. Since the aluminum base 14 is covered with electrically insulating materials, i.e., the anodized aluminum layer 12, the glass-based insulator layer 11, and the glass-based insulator layer 13, the electrode-forming metal can be efficiently deposited from the plating solution only on the base circuit pattern 15.

(Results of Thermal Analysis of Light-Emitting Devices and Light-Emitting Device Substrates)

Referring to FIGS. 4 to 7, the results of thermal analysis of the light-emitting device substrate in the present embodiment will be compared with the results of thermal analysis of a light-emitting device substrate in a comparative embodiment. In the light-emitting device substrate in the present embodiment, one side of the aluminum base functions as a light reflecting surface, and high heat dissipation capability and dielectric withstand capability are ensured by the other side of the aluminum base that is opposite the one side. In the light-emitting device substrate in the comparative embodiment, the ceramic paint containing the glass raw material and the ceramic fired at high temperature is applied to one side of the aluminum base to form a layer that provides the light-reflecting function and also the dielectric withstand function.

The glass-based insulator layer formed of the ceramic paint containing the glass raw material and the ceramic fired at high temperature can provide high reflectivity and high dielectric voltage. However, since the thermal resistance of the glassy material used as the binder is high, the thermal conductivity of the glass-based insulator layer obtained as described above is about 1 to about 3 W/(m·° C.), which is smaller by one order of magnitude than ordinary ceramics and by two orders in magnitude than metals.

When the glass-based insulator layer formed of the ceramic paint containing the glass raw material and the ceramic fired at high temperature is used as the light reflecting layer and also as a dielectric layer, it is necessary that the glass-based insulator layer should have a thickness of about 100 μm.

The light-emitting device substrate in the comparative embodiment has a structure in which the glass-based insulator layer having a relatively large thickness and low thermal conductivity is disposed directly below a light-emitting element. This light-emitting device substrate has a problem in that the thermal resistance is high (the heat dissipation capability is low) and the increase in temperature tends to become large.

Figure 4:
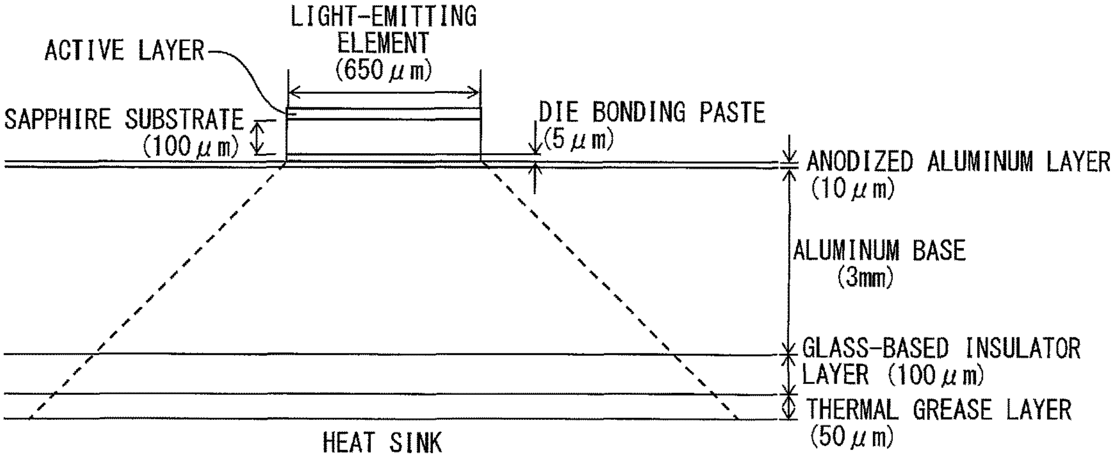
FIG. 4 is an illustration of the light-emitting device in embodiment 1, showing a schematic layer structure in a region in which a light-emitting element is disposed.

FIG. 4 is an illustration of the light-emitting device in the present embodiment, showing a schematic layer structure in a region in which a light-emitting element is disposed, and FIG. 5 shows the thermal conductivity σth, layer thickness d, thermal resistance Rth, and temperature increase ΔT of each of the layers shown in FIG. 4.

As shown in FIG. 4, the light-emitting element is disposed on the light-emitting device substrate, and the light-emitting device substrate has a three-layer structure (the anodized aluminum layer, the aluminum base, and the glass-based insulator layer).

The middle layer of the light-emitting device substrate is the aluminum base having a thickness of 3 mm. The upper surface of the aluminum base is covered with the anodized aluminum layer having a thickness of 10 μm so that the upper surface of the aluminum base serves as a reflective surface, and the lower surface of the aluminum base is covered with the glass-based insulator layer having a thickness of 100 μm and formed from the ceramic paint containing the glass raw material and the ceramic fired at high temperature in order to obtain dielectric voltage.

The light-emitting element is disposed on the light-emitting device substrate, and the light-emitting element is joined to the light-emitting device substrate through a die bonding paste having a thickness of 5 μm. The light-emitting element has a plane size of a longitudinal width of 650 μm and a traverse width of 650 μm, and the thickness from the die bonding paste layer to the active layer of the light-emitting element is 100 μm. A substrate of the light-emitting element is a light-emitting element substrate made of sapphire.

The thermal resistance value of the light-emitting device depends on the position and dimensions of a heat source. In the results for the thermal resistance Rth shown in FIG. 5, the thermal resistance Rth of each of the layers was computed on the assumption that the active layer of the light-emitting element was the only heat source. In FIG. 5, not only the thermal resistance Rth of each layer but also the temperature increase ΔT of each layer was determined. The temperature increase ΔT is a value determined on the assumption that the amount of heat generated by the heat source is 0.15 W.

To compute the thermal resistance Rth of each layer, diffusion of heat in a transverse direction was taken into consideration. Specifically, the thermal resistance Rth of each layer was determined on the assumption that the heat diffused uniformly so as to spread horizontally in directions 45° with respect to the direction perpendicular to the substrate as shown by broken lines in FIG. 4.

The thermal resistance Rth and temperature increase ΔT were determined on the assumptions described above. When a square heat source with a side of "a" (m) is placed on a substrate having a thermal conductivity of σth (W/(m·° C.)) and a layer thickness of d (m), the thermal resistance of this layer is approximated as Rth (° C./W)=d/(σth·a·(a+2d)), and the temperature increase of this layer is given as ΔT (° C.)=Rth·Q. Here, Q (W) is the amount of heat generated by the heat source.

The thermal resistance Rth and temperature increase ΔT of each layer shown in FIG. 5 were determined by the computations described above.

Figure 6:
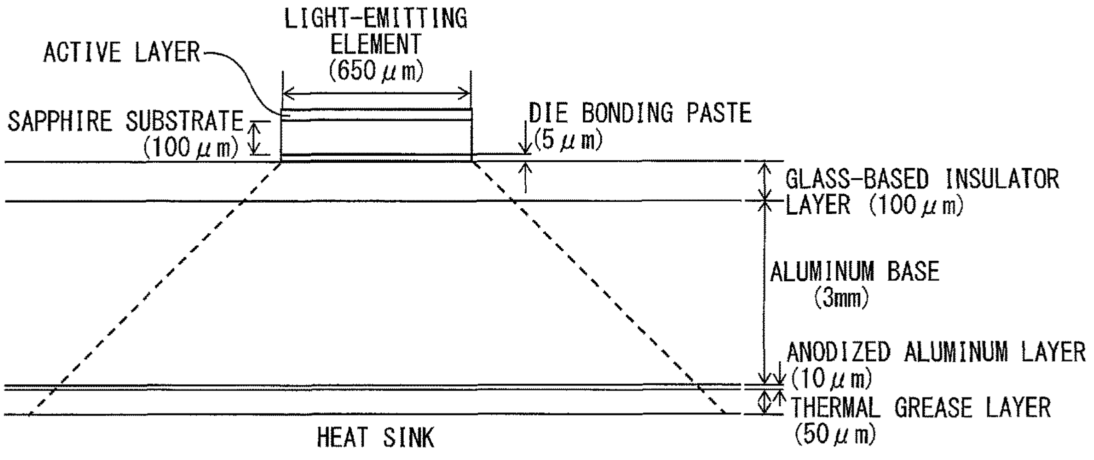
FIG. 6 is an illustration of a light-emitting device in a comparative embodiment, showing a schematic layer structure in a region in which a light-emitting element is disposed.

FIG. 6 is an illustration of the light-emitting device in the comparative embodiment, showing a schematic layer structure in a region in which a light-emitting element is disposed. In this light-emitting device, the ceramic paint containing the ceramic fired at high temperature and the glass raw material is applied to one side of the aluminum base to form a layer that provides the light-reflecting function and also the dielectric withstand function. This light-emitting device is used for the purpose of comparison with the light-emitting device in the present embodiment shown in FIG. 4. FIG. 7 shows the thermal conductivity σth, layer thickness d, thermal resistance Rth, and temperature increase ΔT of each of the layers shown in FIG. 6.

As shown in FIG. 6, the middle layer of the light-emitting device substrate in the comparative embodiment is an aluminum base having a thickness of 3 mm. A glass-based insulator layer having a thickness of 100 μm and having the light-reflecting function and the dielectric withstand function is formed on the upper side of the aluminum base, and an anodized aluminum layer having a thickness of 10 μm and serving as a protective film is formed on the lower side of the aluminum base. Therefore, the light-emitting device substrate in the comparative embodiment has a three-layer structure (the glass-based insulator layer, the aluminum base, and the anodized aluminum layer).

The thermal resistance Rth and temperature increase ΔT of each of the layers shown in FIG. 6 were determined from the thermal conductivity σth and layer thickness d of each layer shown in FIG. 7 using the same method as the method for determining the thermal resistance Rth and temperature increase ΔT shown in FIG. 5.

It is appropriate that the material, thickness, and thermal conductivity necessary for the glass-based insulator layer disposed on the lower side of the aluminum base and used only as the insulating layer as shown in FIG. 4 are different from those necessary for the glass-based insulator layer disposed on the upper side of the aluminum base and serving as the insulating layer and also as the light reflecting layer as shown in FIG. 6. However, in the following comparison, their small differences are neglected on purpose, and these glass-based insulator layers are regarded as layers having a thermal conductivity of 2.4 W/(m·° C.) and a thickness of 100 μm and formed of the same material. In this manner, the comparison can be made with attention focused only on the positions of the glass-based insulator layers (the difference in layer structure).

As shown in FIG. 5, the total thermal resistance of the light-emitting device in the present embodiment shown in FIG. 4 is 68.9° C./W. The total thermal resistance is determined in a region from the sapphire substrate immediately below the active layer of the light-emitting element to a thermal grease layer immediately above a heat dissipation heat sink. The thermal resistance of the light-emitting device substrate having the three-later structure (the anodized aluminum layer, the aluminum base, and the glass-based insulator layer) is 3.9° C./W, and the percent contribution of this thermal resistance to the total thermal resistance is only 6%.

However, as shown in FIG. 7, the total thermal resistance of the light-emitting device in the comparative embodiment shown in FIG. 6 is 140.5° C./W. The total thermal resistance is determined in a region from the sapphire substrate immediately below the active layer of the light-emitting element to a thermal grease layer immediately above a heat dissipation heat sink. The thermal resistance of the conventional light-emitting device substrate having the three-later structure (the glass-based insulator layer, the aluminum base, and the anodized aluminum layer) is 75.6° C./W, and the percent contribution of the thermal resistance of the light-emitting device substrate in the comparative embodiment to the total thermal resistance is as much as 54%.

The total thermal resistance of the light-emitting device in the present embodiment shown in FIG. 4 is 68.9° C./W, and the total thermal resistance of the light-emitting device in the comparative embodiment shown in FIG. 6 is 140.5° C./W. The total thermal resistance of the light-emitting device in the present embodiment is only 49% of the total thermal resistance of the conventional light-emitting device.

The thermal resistance of the light-emitting device substrate of the light-emitting device in the present embodiment shown in FIG. 4 is 3.9° C./W, and the thermal resistance of the light-emitting device substrate of the light-emitting device in the comparative embodiment shown in FIG. 6 is 75.6° C./W. The thermal resistance of the light-emitting device substrate of the light-emitting device in the present embodiment is only 5% of the thermal resistance of the light-emitting device substrate of the light-emitting device in the comparative embodiment.

As can be seen from the above, when attention is focused only on the light-emitting device substrates, the thermal resistance of the light-emitting device substrate of the light-emitting device in the present embodiment is significantly improved.

Comparisons between corresponding layers in FIGS. 5 and 7 show that the effect of improving the thermal resistance is highest for the glass-based insulator layers.

By simply moving the glass-based insulator layer shown in FIG. 6, disposed immediately below the light-emitting element, and having a low thermal conductivity of 2.4 W/(m·° C.) and a thickness of 100 μm to the lower side of the aluminum base so as to be spaced apart from the light-emitting element as shown in FIG. 4, the thermal resistance of this layer can be significantly reduced from 73.41° C./W to only 0.89° C./W, i.e., reduced to about one-eightieth.

As described above, layers having the same thermal conductivity and the same thickness can have greatly different thermal resistances. The thermal resistance of a layer depends on its position in the light-emitting device substrate and whether the layer is close to or away from the heat source. This can be explained by the size of the area of a cross section of a heat path when it crosses each layer.

Suppose that the heat source is a light-emitting element and heat flows from the upper side of a light-emitting device substrate toward its lower side. A region in which the heat diffuses horizontally within a light-emitting device substrate is schematically shown by broken lines in each of FIGS. 4 and 6. Each region surrounded by broken lines corresponds to a heat path. The reason that the width between the broken lines increases toward a lower layer is that the heat flowing in the vertical direction of the light-emitting device substrate diffuses gradually also in the horizontal direction. The cross sectional area of the heat path when it crosses the glass-based insulator layer having a low thermal conductivity of 2.4 W/(m·° C.) is large in FIG. 4 and small in FIG. 6. This is the reason that the thermal resistance of the glass-based insulator layer shown in FIG. 4 with a large cross sectional area of the heat path is low.

The glass-based insulator layers are compared using specific numerical values. The glass-based insulator layer shown in FIG. 4 is farther from the heat source by 3.0 mm than the glass-based insulator layer shown in FIG. 6. The average values of the cross sectional areas of the heat paths in these layers are compared with each other, and the average value for the glass-based insulator layer shown in FIG. 4 is larger by a factor of about 80 than the average value for the glass-based insulator layer shown in FIG. 6. Therefore, conversely, the thermal resistance of the glass-based insulator layer shown in FIG. 4 is lower by a factor of about 80.

In the structure shown in FIG. 6, the heat generated by the light-emitting element substantially directly enters the low-thermal conductivity glass-based insulator layer. In this case, the cross sectional area of the heat path within this layer is substantially the same as the size of the light-emitting element. However, in the structure shown in FIG. 4, the heat enters the low-thermal conductivity glass-based insulator layer through the aluminum base. In this case, the heat diffuses sufficiently in the horizontal direction of the aluminum base when the heat passes through the aluminum base, and the cross sectional area of the heat path within the glass-based insulator layer is very large, so that the thermal resistance can be reduced. The thermal conductivity of the glass-based insulator layer is 2.4 W/(m·° C.), and the thermal conductivity of the aluminum base is 236 W/(m·° C.), which is larger by a factor of 100 than the thermal conductivity of the glass-based insulator layer. Therefore, the influence of the aluminum base on the total thermal resistance is very small.

The above consideration clearly shows that, by simply moving the glass-based insulator layer on the upper side of the aluminum base in FIG. 6 to the lower side of the aluminum base as shown in FIG. 4, the thermal resistance is significantly reduced.

The glass-based insulator layer in FIG. 6 is an insulator layer and functions also as a light reflecting layer. Therefore, when this layer is moved, an alternative structure responsible for the light reflecting function is necessary.

The properties required for the alternative structure in order to effectively utilize the reduction in thermal resistance achieved by moving the glass-based insulator layer to the lower side of the aluminum base are high light reflectivity, low thermal resistance, and stability.

The above-described light reflecting surface obtained by coating the aluminum base with the anodized aluminum layer is optimal for the light reflecting surface that satisfies these conditions.

(Dependence on Thickness of Aluminum Base)

The thermal resistance and the temperature increase have been compared with those of the structure in the comparative embodiment with the thickness of the aluminum base fixed to 3 mm as shown in FIGS. 4 and 6.

The dependence of the thermal resistance on the thickness of the aluminum base in each of the structures in the present embodiment and the comparative embodiment shown in FIGS. 4 and 6 will be examined.

This comparison makes it more clear that the thermal resistance is reduced when the low-thermal conductivity glass-based insulator layer is placed in a position spaced apart from the heat source.

Figure 8:
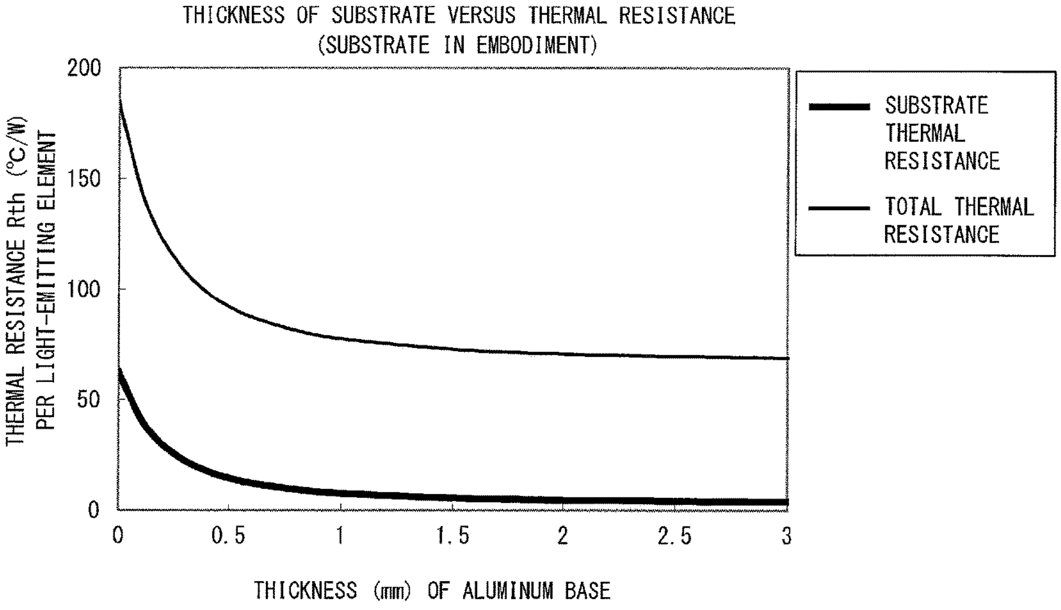
FIG. 8 is a graph showing the dependence of thermal resistance in the light-emitting device in the embodiment shown in FIG. 4 on the thickness of an aluminum base.
Figure 9:
FIG. 9 is a graph showing the dependence of thermal resistance in the light-emitting device in the comparative embodiment shown in FIG. 6 on the thickness of an aluminum base.

FIG. 8 is a graph showing the dependence of the thermal resistance in the light-emitting device in the present embodiment shown in FIG. 4 on the thickness of the aluminum base. FIG. 9 is a graph showing the dependence of the thermal resistance in the light-emitting device in the comparative embodiment shown in FIG. 6 on the thickness of the aluminum base.

FIGS. 8 and 9 show the change in the thermal resistance (° C./W) shown on the vertical axis when the thickness (mm) of the aluminum base shown on the horizontal axis is changed for each of the light-emitting device in the present embodiment and the light-emitting device in the comparative embodiment.

The computational conditions used are the same as the above-described conditions used to compute the thermal resistance with the thickness of the aluminum base fixed to 3 mm. The thermal resistance Rth determined is a value per light-emitting element, and two values, i.e., the total thermal resistance and the substrate thermal resistance, were determined. The total thermal resistance is the thermal resistance from the active layer of the light-emitting element to the heat sink, and the thermal resistance caused by the light-emitting device substrate is referred to as the substrate thermal resistance.

As shown in FIGS. 8 and 9, the total thermal resistance decreases as the thickness of the aluminum base increases, and the reduction in total thermal resistance is steeper and larger in the light-emitting device in the present embodiment than in the light-emitting device in the comparative embodiment. In the light-emitting device in the present embodiment, the value of the substrate thermal resistance decreases sharply as the thickness of the aluminum base increases. However, in the light-emitting device in the comparative embodiment, the value of the substrate thermal resistance is substantially constant. In detail, the thermal resistance increases gradually from 74° C./W to 76° C./W.

Figure 28:
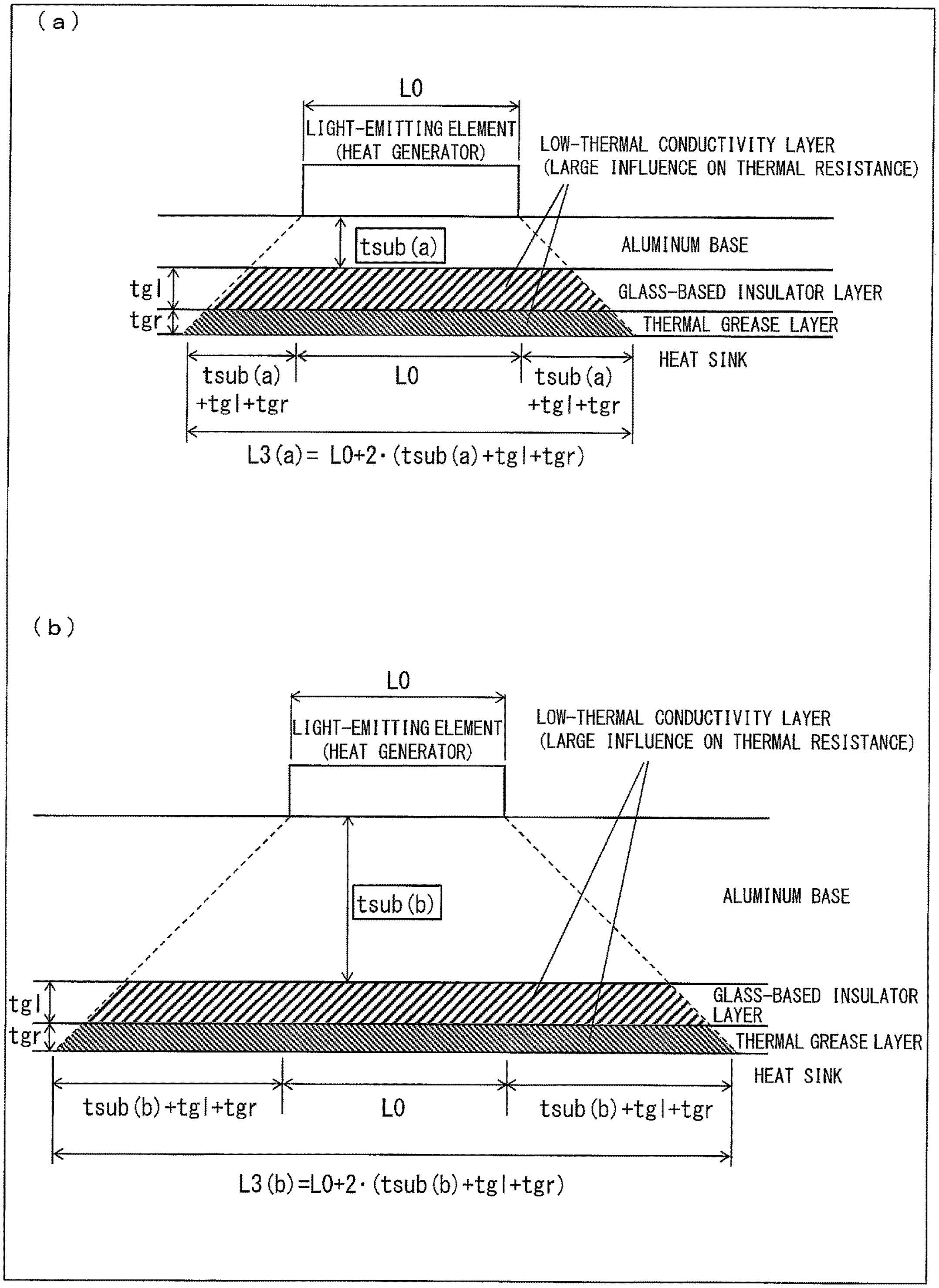
FIG. 28 shows schematic diagrams explaining the reason that the thermal resistance in the light-emitting device in the embodiment shown in FIG. 4 decreases sharply as the thickness of the aluminum base increases.

FIG. 28 shows schematic diagrams explaining the reason that the thermal resistance in the light-emitting device in the present embodiment shown in FIG. 4 decreases sharply as the thickness of the aluminum base increases.

FIG. 28(*a*) is an illustration showing an aluminum base having a small thickness, and FIG. 28(*b*) is an illustration showing an aluminum base having a large thickness.

Figure 29:
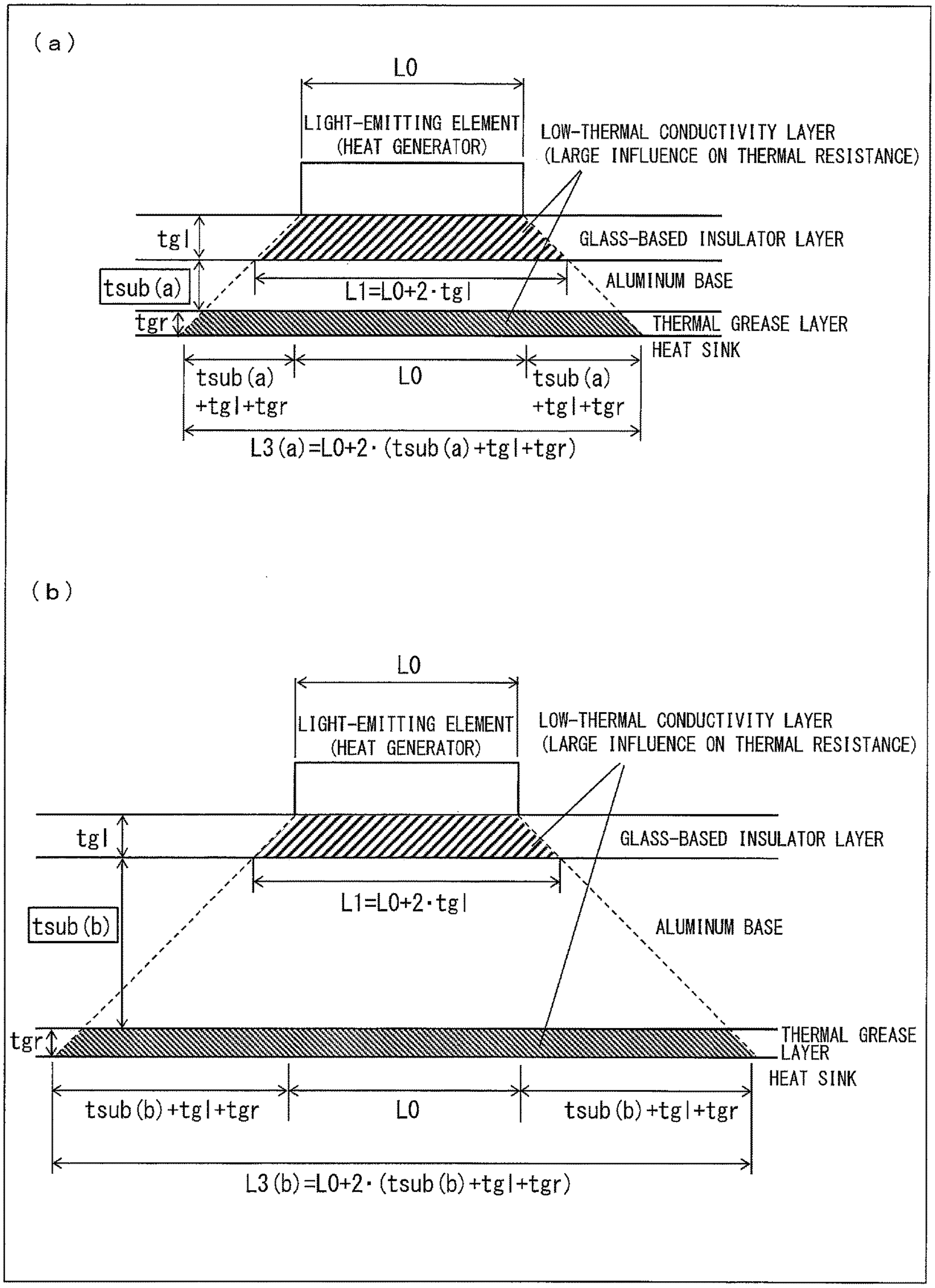
FIG. 29 shows schematic diagrams explaining the reason that the thermal resistance in the light-emitting device in the comparative embodiment shown in FIG. 6 is substantially constant even when the thickness of the aluminum base increases.

FIG. 29 shows schematic diagrams explaining the reason that the thermal resistance in the light-emitting device in the comparative embodiment shown in FIG. 6 is substantially constant even when the thickness of the aluminum base increases.

FIG. 29(*a*) is an illustration showing an aluminum base having a small thickness, and FIG. 29(*b*) is an illustration showing an aluminum base having a large thickness. In the following description, a comparison is made between FIGS. 28 and 29.

In the schematic diagrams shown in FIGS. 28 and 29, the active layer, the sapphire substrate, the die bonding paste, and the anodized aluminum layer are omitted.

As shown in each of the schematic diagrams in FIG. 28, the low-thermal conductivity glass-based insulator layer is disposed on the lower side of the aluminum base and located at a position farther from the light-emitting element (heat generator) serving as the heat source than in the schematic diagrams in FIG. 29. Therefore, as shown in FIG. 28, when the thickness of the aluminum base is increased from the thickness tsub(a) in FIG. 28(*a*) to the thickness tsub(b) in FIG. 28(*b*), the glass-based insulator layer and the thermal grease layer can be spaced farther apart from the light-emitting element, and both the substrate thermal resistance and the total thermal resistance can thereby be reduced.

Specifically, since the thermal conductivity of the aluminum base is sufficiently higher than that of the glass-based insulator layer and the thermal grease layer, which are low-thermal conductivity layers, the contribution of the aluminum base to the thermal resistance accounts for a small percentage. Therefore, when the high-thermal conductivity aluminum base is increased in thickness (from the thickness tsub(a) of the aluminum base in FIG. 28(*a*) to the thickness tsub(b) of the aluminum base in FIG. 28(*b*)), the width of the heat path increases in the glass-based insulator layer and the thermal grease layer, which are low-thermal conductivity layers, (from L3(*a*) in FIG. 28(*a*) to L3(*b*) in FIG. 28(*b*)) as shown in FIG. 28(*b*). In this case, the cross sectional area of the heat flow path increases, and the thermal resistance decreases because the thermal resistance is inversely proportional to the cross sectional area of the heat path.

As shown in each of the schematic diagrams in FIG. 29, in the light-emitting device in the comparative embodiment, the glass-based insulator layer, which is one of the low-thermal conductivity layers, is disposed on the upper side of the aluminum base and located in the vicinity of the light-emitting element (heat generator) serving as the heat source. The thermal grease layer is disposed on the lower side of the aluminum base. In this case, even when the thickness of the aluminum base is increased from the thickness tsub(a) to the thickness tsub(b) in the same manner as described with reference to FIG. 28, only the thermal grease layer can be spaced farther from the light-emitting element. The low-thermal conductivity glass-based insulator layer is still located in the vicinity of the light-emitting element, as shown in FIG. 29. Therefore, although the total thermal resistance decreases, the substrate thermal resistance does not decrease, as shown in FIG. 9.

Specifically, since the thermal conductivity of the aluminum base is sufficiently higher than that of the glass-based insulator layer and the thermal grease layer, which are low-thermal conductivity layers, the contribution of the aluminum base to the thermal resistance accounts for a small percentage. Therefore, the high-thermal conductivity aluminum base is increased in thickness (from the thickness tsub(a) of the aluminum base in FIG. 29(*a*) to the thickness tsub(b) of the aluminum base in FIG. 29(*b*)). However, as shown in FIG. 29(*b*), in the glass-based insulator layer, which is one of the low-thermal conductivity layers, the width of the heat path is constant (L1 in FIGS. 29(*a*) and 29(*b*)). Therefore, in the glass-based insulator layer, the cross sectional area of the heat flow path is constant. Since the thermal resistance is inversely proportional to the cross sectional area of the heat path, the thermal resistance is constant even when the aluminum base is increased in thickness. However, when the aluminum base is increased in thickness (from the thickness tsub(a) of the aluminum base in FIG. 29(*a*) to the thickness tsub(b) of the aluminum base in FIG. 29(*b*)), the width of the heat path increases (from L3(*a*) in FIG. 29(*a*) to L3(*b*) in FIG. 29(*b*)) in the low-thermal conductivity thermal grease layer disposed on the lower side of the aluminum base. Therefore, the thermal resistance decreases in the thermal grease layer.

Figure 10:
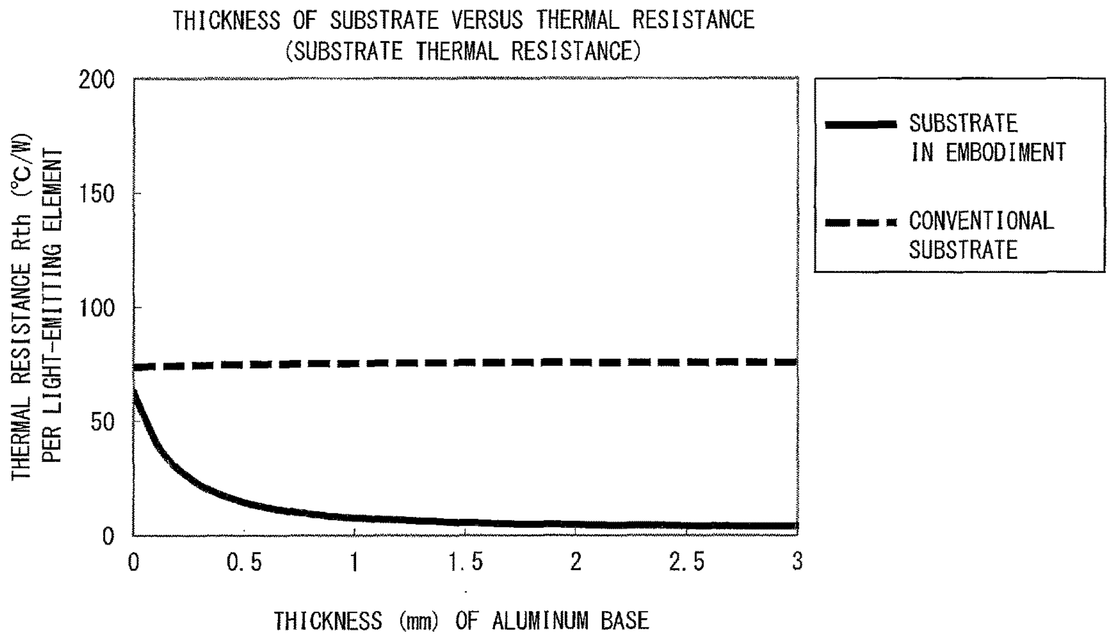
FIG. 10 is a graph showing only the substrate thermal resistances in FIGS. 8 and 9, which are the thermal resistances caused by the light-emitting device substrates.

FIG. 10 is a graph showing only the substrate thermal resistances in FIGS. 8 and 9, which are the thermal resistances caused by the light-emitting device substrates.

The substrate thermal resistance of the light-emitting device in the present embodiment is shown by a solid line, and the substrate thermal resistance in the light-emitting device in the comparative embodiment is shown by a broken line.

Specifically, as shown in FIG. 10, the substrate thermal resistances when the thickness of the aluminum base is 0.1 mm are 41° C./W (the structure in the present embodiment) and 74° C./W (the structure in the comparative embodiment), and the substrate thermal resistances when the thickness of the aluminum base is 0.5 mm are 15° C./W (the structure in the present embodiment) and 75° C./W (the structure in the comparative embodiment). The substrate thermal resistances when the thickness of the aluminum base is 1 mm are 8° C./W (the structure in the present embodiment) and 75° C./W (the structure in the comparative embodiment), and the substrate thermal resistances when the thickness of the aluminum base is 3 mm are 4° C./W (the structure in the present embodiment) and 76° C./W (the structure in the comparative embodiment).

The ratio of the substrate thermal resistance in the light-emitting device in the present embodiment to the substrate thermal resistance in the light-emitting device in the comparative embodiment is as follows. When the thickness of the aluminum base is 0.1 mm, this ratio is as much as 55%. However, when the thickness of the aluminum base is 0.5 mm, the ratio is less than 20%, i.e., 19%. The ratio is 10% when the thickness of the aluminum base is 1 mm and is only 5% when the thickness of the aluminum base is 3 mm.

As described above for the thermal resistance determined with the thickness of the aluminum base fixed to 3 mm, in order to reduce the thermal resistance, it is effective to separate the low-thermal conductivity glass-based insulator layer from the heat source. This consideration has been made more clear by the relation between the thermal resistance and the thickness of the aluminum base shown in FIG. 10 and the schematic diagrams shown in FIGS. 28 and 29.

(Light-Emitting Devices in which a Plurality of Light-Emitting Elements are Arranged)

The thermal resistance in light-emitting devices in which a plurality of light-emitting elements are arranged will next be examined.

When the light-emitting elements are spaced apart from each other sufficiently, the thermal resistance can be determined, for example, in the manner shown in FIG. 4. Specifically, the thermal resistance in the heat dissipation region shown by broken lines can be determined with no consideration given to heat dissipation from adjacent light-emitting elements. However, when light-emitting elements are arranged on a light-emitting device substrate so as to be adjacent to each other, the heat dissipation regions of adjacent light-emitting elements may overlap each other and interfere with each other.

Figure 11:
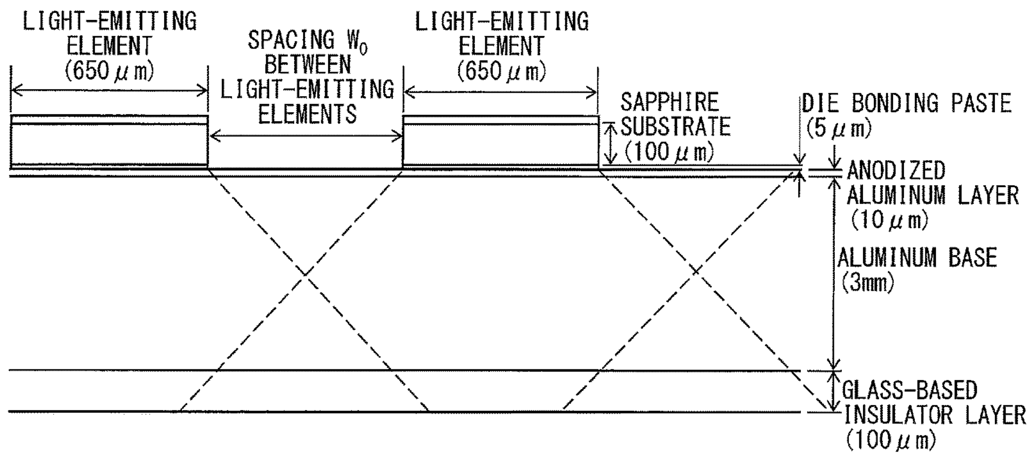
FIG. 11 is an illustration showing a light-emitting device including a plurality of light-emitting elements arranged such that heat dissipation regions of adjacent light-emitting elements overlap each other.

FIG. 11 is an illustration showing a light-emitting device including a plurality of light-emitting elements arranged such that the heat dissipation regions of adjacent light-emitting elements overlap each other.

As illustrated, the heat dissipation regions of adjacent light-emitting elements that are shown by broken lines overlap each other and interfere with each other. Therefore, it is necessary to make corrections to heat flows from individual light-emitting elements in consideration of the interference.

Figure 12:
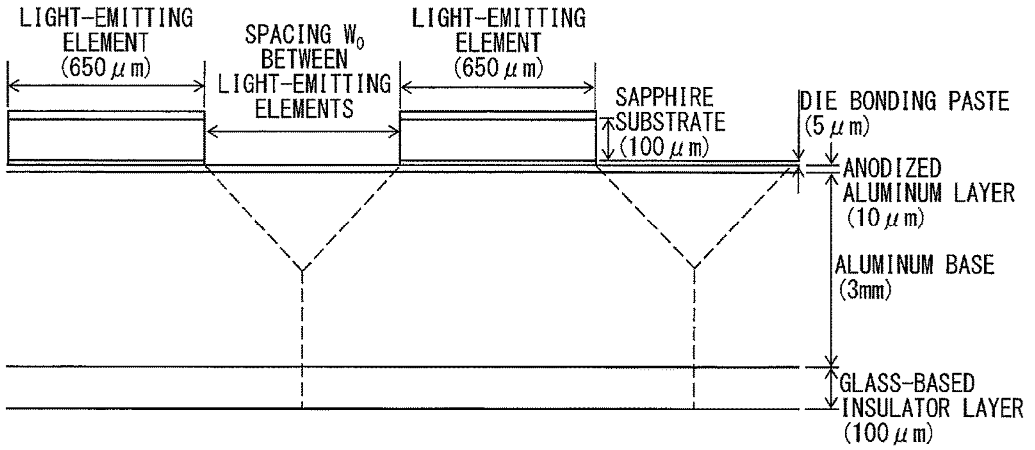
FIG. 12 is an illustration showing a light-emitting device including a plurality of light-emitting elements arranged such that the spacing $W_0$ between the light-emitting elements is adjusted to 650 μm in consideration of the interference between the heat dissipation regions of adjacent light-emitting elements.

FIG. 12 is an illustration when the spacing $W_0$ between the light-emitting elements is adjusted to 650 μm in consideration of the interference between the heat dissipation regions of adjacent light-emitting elements.

As illustrated, the spacing $W_0$ between the light-emitting elements is adjusted to 650 μm. Heat flow regions in this case were corrected such that the heat dissipation regions of adjacent light-emitting elements shown by broken lines did not overlap each other.

Figure 13:
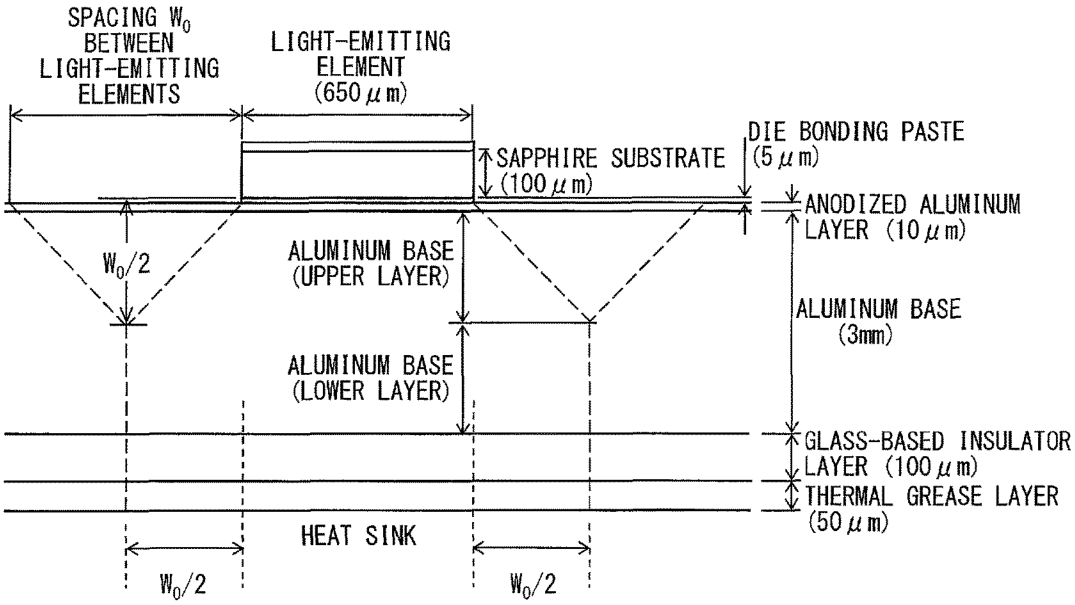
FIG. 13 is an illustration showing a model structure for determining the thermal resistance when the spacing $W_0$ between the light-emitting elements is adjusted to 650 μm as shown in FIG. 12.

FIG. 13 is an illustration showing a model structure for determining the thermal resistance when the spacing $W_0$ between the light-emitting elements is adjusted to 650 μm as shown in FIG. 12.

In the above-described case, the thermal resistance Rth of the light-emitting device substrate per light-emitting element was determined using the structure of the light-emitting device in the present embodiment shown in FIG. 4. For the light-emitting device in the present embodiment in which a plurality of light-emitting elements are arranged with the spacing $W_0$ between the light-emitting elements adjusted to 650 μm, the model structure shown in FIG. 13 was used to determine the thermal resistance Rth of the light-emitting device substrate per light-emitting element.

In the example described, the spacing $W_0$ between the light-emitting elements is adjusted to 650 μm, and the light-emitting device is modeled such that the heat dissipation regions of adjacent light-emitting elements do not interfere with each other. The above correction is applicable to any spacing $W_0$ between the light-emitting elements, and the spacing $W_0$ between the light-emitting elements is not limited to 650 μm.

FIG. 14 shows the thermal resistance Rth and temperature increase ΔT of each of the layers that were determined from the thermal conductivity σth and layer thickness d of each layer using the model structure shown in FIG. 13.

Also for the structure of the light-emitting device in the comparative embodiment shown in FIG. 6, the thermal resistance Rth and temperature increase ΔT of each of the layers can be determined from the thermal conductivity σth and layer thickness d of each layer using a model structure in which the spacing $W_0$ between the light-emitting elements is adjusted in the same manner as described above.

Figure 15:
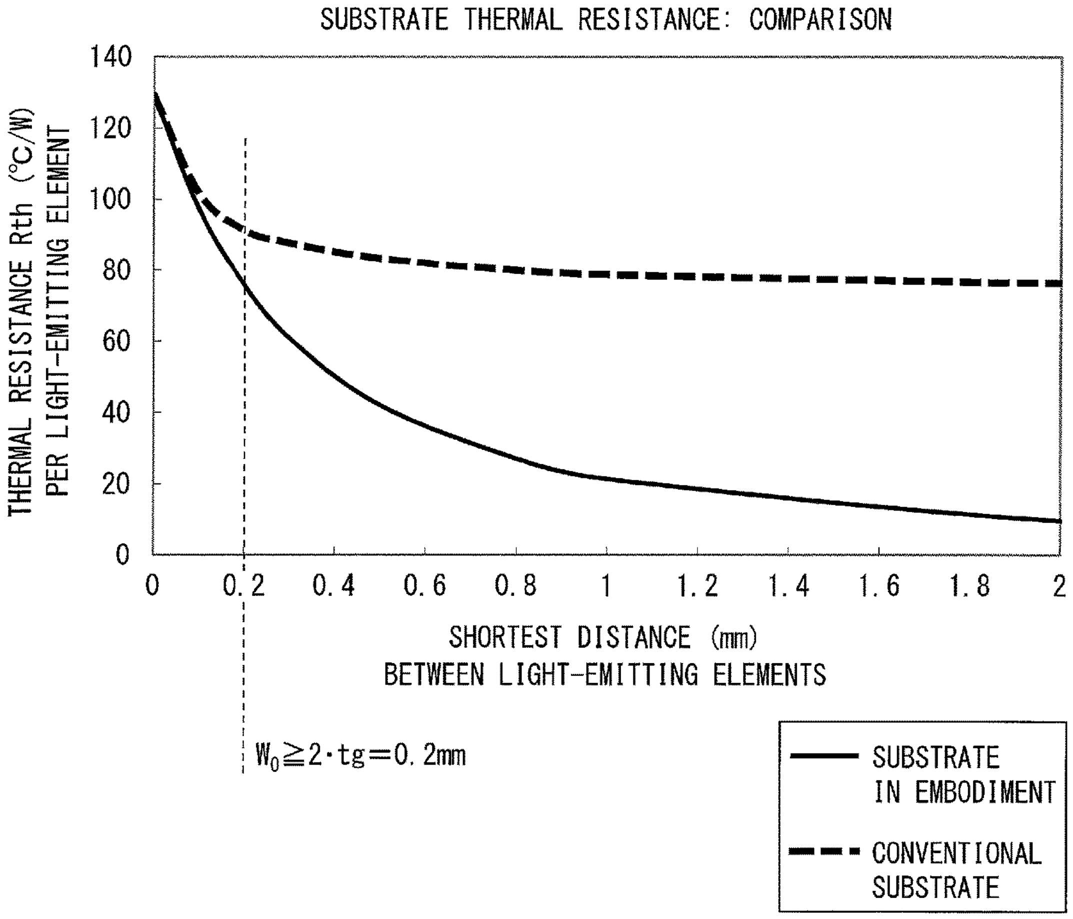
FIG. 15 is a graph showing the substrate thermal resistance per light-emitting element for each of the light-emitting device substrate in the embodiment shown in FIG. 4 and the light-emitting device substrate in the comparative embodiment shown in FIG. 6 when the spacing $W_0$ between the light-emitting elements (the shortest distance between the light-emitting elements) is changed.

FIG. 15 is a graph showing the substrate thermal resistance per light-emitting element for each of the light-emitting device substrate in the present embodiment shown in FIG. 4 and the light-emitting device substrate in the comparative embodiment shown in FIG. 6 when the spacing $W_0$ between light-emitting elements (the shortest distance between the light-emitting elements) is changed.

In FIG. 15, the relation between the thermal resistance Rth per light-emitting element and the spacing $W_0$ between the light-emitting elements when the heat generators are arranged on the substrate is shown. Specifically, for comparison purposes, the relation in the light-emitting device substrate in the present embodiment is shown by a solid line, and the relation in the light-emitting device substrate in the comparative embodiment is shown by a broken line. Each heat generator has plane dimensions of 650 μm×650 μm, and the glass-based insulator layer has a thickness tg of 100 μm. FIG. 15 shows only the substrate thermal resistance, and the total thermal resistance will be described later using FIG. 18.

As illustrated, in a region in which the spacing $W_0$ between the light-emitting elements (the shortest distance between the light-emitting elements) is $W_0 \geq 2\times tg$, the thermal resistance Rth of the light-emitting device substrate in the present embodiment is significantly improved as compared to the thermal resistance Rth of the light-emitting device substrate in the comparative embodiment.

The thermal resistance in FIG. 15 was determined when the thickness tg of the glass-based insulator layer was 100 μm. It can be seen that, when $W_0 \geq 2\times tg = 200$ μm, i.e., $W_0 \geq 0.2$ mm, the substrate thermal resistance of the substrate in the present embodiment decreases sharply as compared to that of the conventional substrate.

As the spacing $W_0$ between the light-emitting elements increases further, the thermal resistance decreases when $W_0$ is within the range of $W_0 \leq 2\times ds$, where ds is the thickness of the aluminum base in the light-emitting device substrate in the present embodiment. When $W_0 \geq 2\times ds$, the thermal resistance becomes constant.

As can be seen from FIG. 12, when $W_0 = 2\cdot ds$, the flows of heat from the light-emitting elements that are shown by broken lines do not overlap each other. When the spacing between the light-emitting elements is further increased, i.e., $W_0 \geq 2\times ds$, adjacent light-emitting elements have no mutual influence on their heat dissipation, and the thermal resistance is the same as that of a single light-emitting element.

Conversely, it can be said that, to minimize the thermal resistance of the light-emitting device substrate in the present embodiment with a given spacing $W_0$ between the light-emitting elements, the thickness ds of the aluminum base is set to $ds \geq W_0/2$. It is desirable that ds is at least $W_0/2$.

When the thickness ds of the aluminum base is given, adjacent light-emitting elements have no mutual influence on their heat dissipation if the spacing $W_0$ between the light-emitting elements satisfies the relation $W_0 \geq 2\times ds$. Specifically, when the thickness of the aluminum base is, for example, 3 mm, the spacing between the light-emitting elements is 6 mm or more in order to achieve ideal heat dissipation.

Conversely, when the spacing $W_0$ between the light-emitting elements is given, the thermal resistance of the light-emitting device substrate in the present embodiment can be minimized if the thickness ds of the aluminum base satisfies the relation $ds \geq W_0/2$. Specifically, when the spacing $W_0$ between the light-emitting elements is fixed to 1 mm, the thermal resistance is substantially constant if the thickness of the aluminum base is 0.5 mm or more. Since the thermal conductivity of the aluminum base is high, the influence of the aluminum base on the thermal resistance is very small even when the thickness of the aluminum base is large, e.g., 10 mm or less or 5 mm or less, so long as the thickness is reasonable.

A description will be given of the reason that the thermal resistance Rth of the light-emitting device substrate in the present embodiment is significantly improved in the region in which $W_0 \geq 2\times tg$ as compared to the thermal resistance Rth of the light-emitting device substrate in the comparative embodiment.

Figure 16:
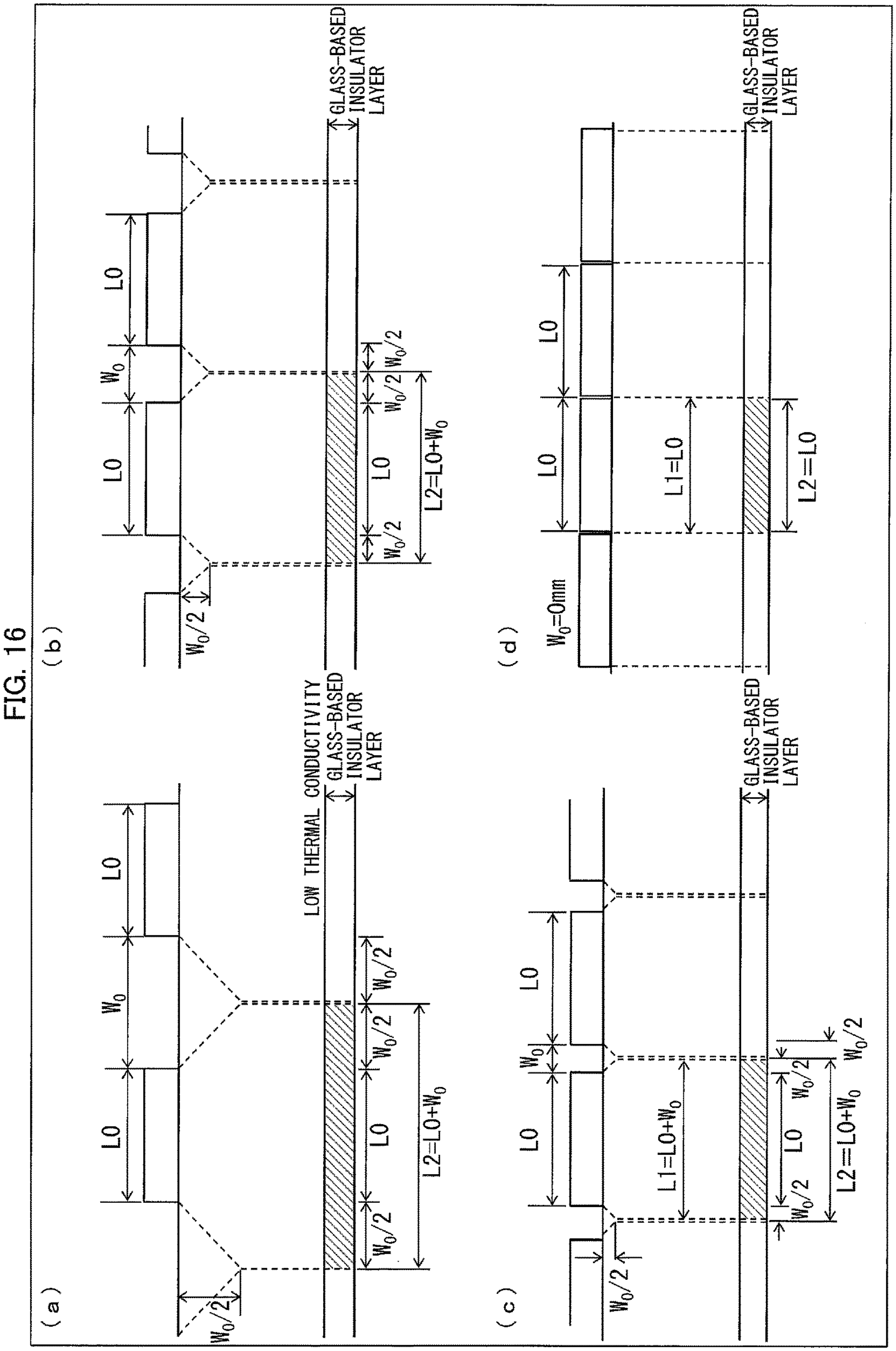
FIG. 16 shows schematic diagrams of the light-emitting device substrate in the embodiment which includes a low-thermal conductivity glass-based insulator layer disposed on the rear side of an aluminum base and on which light-emitting elements are arranged.

FIG. 16 shows schematic diagrams of the light-emitting device substrate in the present embodiment which includes the low-thermal conductivity glass-based insulator layer disposed on the rear side of the aluminum base and on which light-emitting elements are arranged.

FIGS. 16(*a*) to 16(*d*) are schematic side views each showing heat generators composed of light-emitting elements with a side length of L0 and arranged two-dimensionally at regular spacings $W_0$.

The thermal resistance was determined under the assumption that heat generated from the light-emitting elements flows within regions shown by broken lines. A diagonally shaded region in each figure corresponds to a region responsible for the thermal resistance of the glass-based insulator layer for one light-emitting element.

The thermal resistance of the diagonally shaded region is denoted by RH (glass-based insulator layer). The width L2 of the diagonally shaded region is $L2 = L0 + W_0$ in FIG. 16(*a*). The thickness of the glass-based insulator layer is tg. When the thermal conductivity of the glass-based insulator layer is denoted by σth, the thermal resistance RH (glass-based insulator layer) of the diagonally shaded region in FIG. 16(*a*) can be determined using formula 1 below.

$$\text{RH (glass-based insulator layer)} = tg/(\sigma th \cdot L2 \cdot L2) \quad \text{(formula 1)}$$

In formula 1, $L2 = L0 + W_0$.

Formula 1 above can also be used even when $W_0$ is 0 or close to 0, as in FIGS. 16(*b*), 16(*c*), and 16(*d*).

Figure 17:
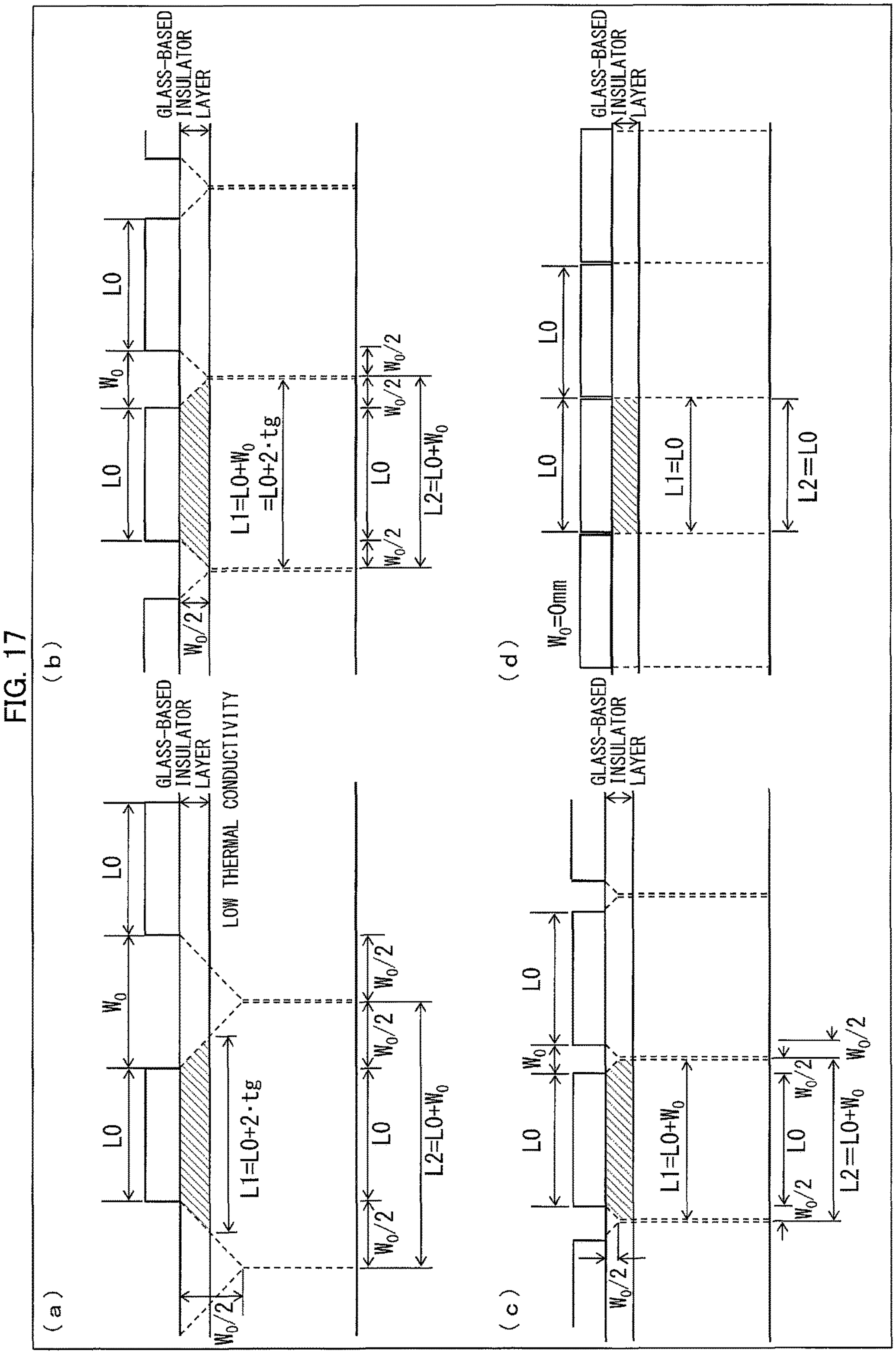
FIG. 17 shows schematic diagrams of the light-emitting device substrate in the comparative embodiment which includes a low-thermal conductivity glass-based insulator layer disposed on the upper side of an aluminum base and on which light-emitting elements are arranged.

FIG. 17 shows schematic diagrams of the light-emitting device substrate in the comparative embodiment which includes the low-thermal conductivity glass-based insulator layer disposed on the upper side of the aluminum base and on which light-emitting elements are arranged.

FIGS. 17(*a*) to 17(*d*) are schematic side views each showing heat generators composed of light-emitting elements with a side length of L0 and arranged directly on the glass-based insulator layer two-dimensionally at regular spacings $W_0$. $W_0$s in FIGS. 16(*a*) to 16(*d*) correspond to $W_0$s in FIGS. 17(*a*) to 17(*d*), respectively. Particularly, FIGS. 16(*b*) and 17(*b*) are schematic diagrams when $W_0 = 2\times tg$.

A region of the glass-based insulator layer in FIG. 17(*a*) that corresponds to the diagonally shaded region of the glass-based insulator layer shown in FIG. 16(*a*) is also diagonally shaded in FIG. 17(*a*). The diagonally shaded region in FIG. 17(*a*) corresponds to a region responsible for the thermal resistance of the glass-based insulator layer for one light-emitting element. The thermal resistance of the diagonally shaded region is denoted by RH' (glass-based insulator layer), and the width L1 of the lower edge of the diagonally shaded region is $L1 = L0 + 2\times tg$.

The thermal resistance RH' (glass-based insulator layer) of the diagonally shaded region in FIG. 17(*a*) can be determined using formula (2) below.

$$RH' \text{ (glass-based insulator layer)}=tg/(\sigma th\cdot L0\cdot L1) \quad \text{(formula 2)}$$

In formula 2, L1=L0+2×tg.

When the spacing $W_0$ between the light-emitting elements is used as a variable, L1 is constant in the range of from $W_0$ in FIG. 17(*a*) to $W_0$ in FIG. 17(*b*). Therefore, RH' (glass-based insulator layer) is also constant in this range.

As the value of $W_0$ changes from the value shown in FIG. 16(*a*) toward the value shown in FIG. 16(*b*), the value of L2 approaches the value of L1 shown in FIG. 17. As the value of $W_0$ changes from the value shown in FIG. 17(*a*) toward the value shown in FIG. 17(*b*), the value of L2 shown in FIG. 17 approaches the value of L1 shown in FIG. 17.

Therefore, as for the thermal resistance RH (glass-based insulator layer) and thermal resistance RH' (glass-based insulator layer) corresponding to the diagonally shaded regions in the schematic diagrams, the value of the thermal resistance RH (glass-based insulator layer) approaches the value of the thermal resistance RH' (glass-based insulator layer).

Finally, L2 coincides with L1 (L2=L1) when $W_0$ is the value in FIGS. 16(*b*) and 17(*b*).

Therefore, the thermal resistance in this case can be determined using formula 3 below with formulas 1 and 2 above.

$$RH' \text{ (glass-based insulator layer)}/RH \text{ (glass-based insulator layer)}=L1/L0 \quad \text{(formula 3)}$$

In formula 3, L1=L0+2×tg.

Generally, the thickness tg of the glass-based insulator layer is sufficiently smaller than the side length L0 of the light-emitting elements. If the condition tg>>L0 holds, L1/L0=1+2×tg/L0≈1.

Therefore, it is found that, in FIGS. 16(*b*) and 17(*b*), the approximation RH' (glass-based insulator layer)≈RH (glass-based insulator layer) holds.

As the value of $W_0$ changes from the value shown in FIG. 16(*b*) toward the value shown in FIG. 16(*c*), the value of the thermal resistance RH (glass-based insulator layer) further approach the value of the thermal resistance RH' (glass-based insulator layer).

Similarly, as the value of $W_0$ changes from the value shown in FIG. 17(*b*) toward the value shown in FIG. 17(*c*), the value of the thermal resistance RH (glass-based insulator layer) further approaches the value of the thermal resistance RH' (glass-based insulator layer).

Finally, in FIGS. 16(*d*) and 17(*d*) in which the value of $W_0$ is 0, RH' (glass-based insulator layer)=RH (glass-based insulator layer).

For the purpose of examining the relation among the spacing $W_0$ between the light-emitting elements, the thickness tg of the glass-based insulator layer, and the thermal resistance of the light-emitting device substrate, studies were conducted on the cases shown in FIGS. 16(*b*) and 17(*b*) in which the relation RH' (glass-based insulator layer)≈RH (glass-based insulator layer) holds in the diagonally shaded portions in the schematic diagrams.

In these cases, the relation L2=L1 holds. When L2=L1, the relation $W_0$=2×tg holds between the spacing $W_0$ between the light-emitting elements and the thickness tg of the glass-based insulator layer. This relation is obtained using L1=L0+2×tg and L2=L0+$W_0$ which are formulas defining L1 and L2 in formulas 1 and 2.

In FIGS. 16(*a*) and 17(*a*), the relation $W_0$>2×tg holds between the spacing $W_0$ between the light-emitting elements and the thickness tg of the glass-based insulator layer. In this case, the relation RH (glass-based insulator layer)<RH' (glass-based insulator layer) holds between the values of the thermal resistances of the glass-based insulator layers.

In FIGS. 16(*c*) and 17(*c*), the relation $W_0$<2×tg holds between the spacing $W_0$ between the light-emitting elements and the thickness tg of the glass-based insulator layer. In this case, the relation RH (glass-based insulator layer) RH' (glass-based insulator layer) holds between the values of the thermal resistances of the glass-based insulator layers, and both the values of the thermal resistances are high.

In FIGS. 16(*b*) and 17(*b*), the relation $W_0$=2×tg holds between the spacing $W_0$ between the light-emitting elements and the thickness tg of the glass-based insulator layer. At this point, the relation between the values of the thermal resistances of the glass-based insulator layers changes from RH (glass-based insulator layer)<RH' (glass-based insulator layer) to RH (glass-based insulator layer)≈RH' (glass-based insulator layer). Specifically, this point corresponds to the boundary between these relations.

As can be seen from the above, when the relation $W_0$≥2×tg holds between the spacing $W_0$ between the light-emitting elements and the thickness tg of the glass-based insulator layer, the relation RH (glass-based insulator layer)<RH' (glass-based insulator layer) becomes significant. Therefore, when a light-emitting device is produced by arranging a plurality of light-emitting elements on the light-emitting device substrate in the present embodiment, the light-emitting device produced can have significantly low thermal resistance.

Figure 18:
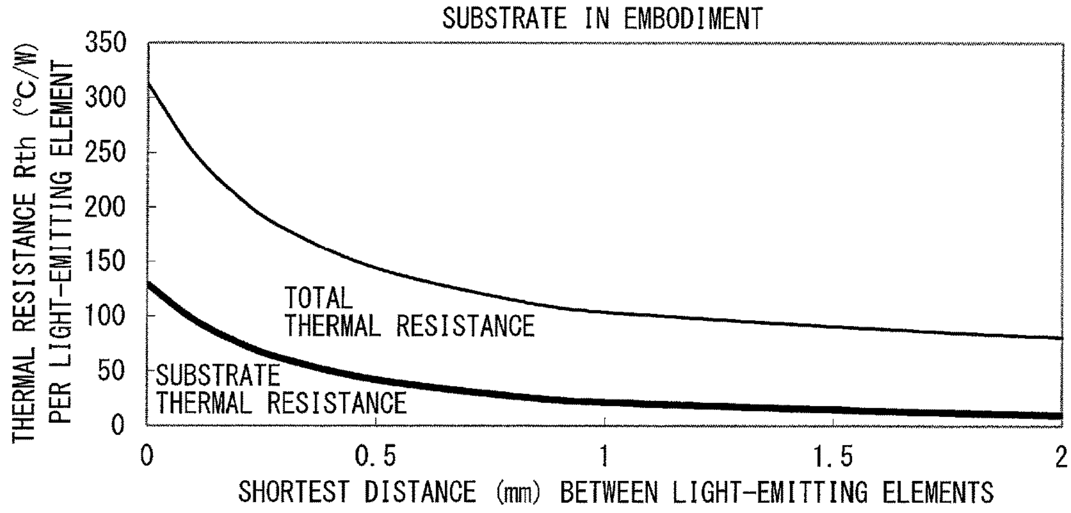
FIG. 18 is a graph showing the substrate thermal resistance per light-emitting element and the total thermal resistance when the light-emitting device substrate in the embodiment shown in FIG. 4 is used and the spacing $W_0$ between the light-emitting elements is changed.

FIG. 18 is a graph showing the substrate thermal resistance per light-emitting element and the total thermal resistance when the light-emitting device substrate in the present embodiment shown in FIG. 4 is used and the spacing $W_0$ between the light-emitting elements (the shortest distance between the light-emitting elements) is changed.

Figure 19:
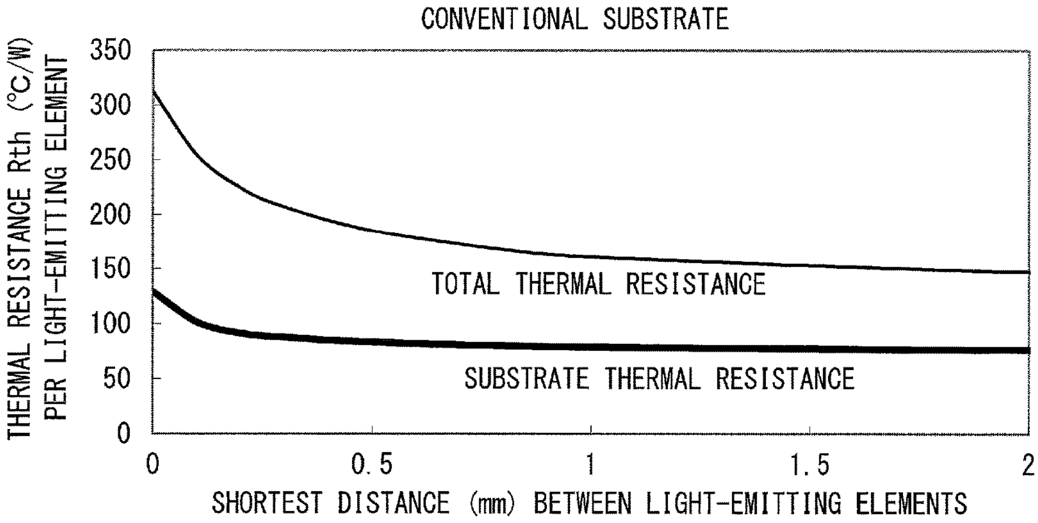
FIG. 19 is a graph showing the substrate thermal resistance per light-emitting element and the total thermal resistance when the light-emitting device substrate in the comparative embodiment shown in FIG. 6 is used and the spacing $W_0$ between the light-emitting elements is changed.

FIG. 19 is a graph showing the substrate thermal resistance per light-emitting element and the total thermal resistance when the light-emitting device substrate in the comparative embodiment shown in FIG. 6 is used and the spacing $W_0$ between the light-emitting elements (the shortest distance between the light-emitting elements) is changed.

The above total thermal resistance is the thermal resistance from the active layer of a light-emitting element of the light-emitting device mounted on the heat sink to the heat sink and is particularly the thermal resistance per light-emitting element.

As shown in FIGS. 18 and 19, when the light-emitting elements are arranged two-dimensionally at regular intervals of, for example, 2 mm, the substrate thermal resistance of the substrate in the present embodiment is significantly smaller than the substrate thermal resistance of the substrate in the comparative embodiment, i.e., is only about 10% the substrate thermal resistance in the comparative embodiment.

When the total thermal resistances including the thermal resistances of the light-emitting elements etc. are compared, the total thermal resistance in the present embodiment is about half, i.e., about 50% to 60%, the total thermal resistance in the comparative embodiment. The reason for this is as follows. The thermal resistances of components other than the substrate such as the light-emitting elements account for about half the total thermal resistance, and the values of the thermal resistances of these components are almost constant irrespective of the thermal resistance of the substrate. Therefore, even when the thermal resistance of the substrate is reduced, these values remain unchanged.

In other words, the light-emitting device substrate in the present embodiment includes only thermal resistance parts that cannot be removed because they are essential for the mechanism of the light-emitting device, and all other parts have been removed. The light-emitting device of the present embodiment uses the above light-emitting device substrate.

Embodiment 2

Embodiment 2 of the present invention will next be described with reference to FIG. 20. In embodiment 1 described above, the chemical polishing step and the anodic oxidation that use an erosive chemical such as an etching solution or an acid, e.g., dilute sulfuric acid, are performed first, and then the step of forming the base circuit pattern 15 is performed. The present embodiment is different from embodiment 1 described above in that, in a process for producing a light-emitting device substrate 2*a*, the step of forming the base circuit pattern 15 is performed before the chemical polishing step and the anodic oxidation that use an erosive chemical such as an etching solution or an acid. The rest of the configuration is as described in embodiment 1. For convenience of description, members having the same functions as those of members shown in the figures in embodiment 1 described above are denoted by the same symbols, and the description thereof will be omitted.

In embodiment 1 described above, the light-emitting device substrate 2 is produced in the following process procedure.

First, a first step of providing the glass-based insulator layer 11 and the glass-based insulator layer 13 on the aluminum base 14 is performed, and then a second step of polishing the surface of the aluminum base 14 that is not covered with the glass-based insulator layer 11 and the glass-based insulator layer 13 is performed. Next, a third step of subjecting the polished surface of the aluminum base 14 to anodic oxidation to thereby form a light reflecting surface covered with the anodized aluminum layer 12 is performed, and then a fourth step of subjecting the anodized aluminum layer 12 to pore sealing treatment is performed. Next, a fifth step of forming the base circuit pattern 15 on the glass-based insulator layer 11 is performed, and then a sixth step of removing the resin coating layer on the base circuit pattern 15 to expose the conductive layer to thereby form a base circuit pattern 15*a* is performed. Finally, a seventh step of forming electrode patterns is performed, and the light-emitting device substrate 2 is thereby produced.

Figure 20:
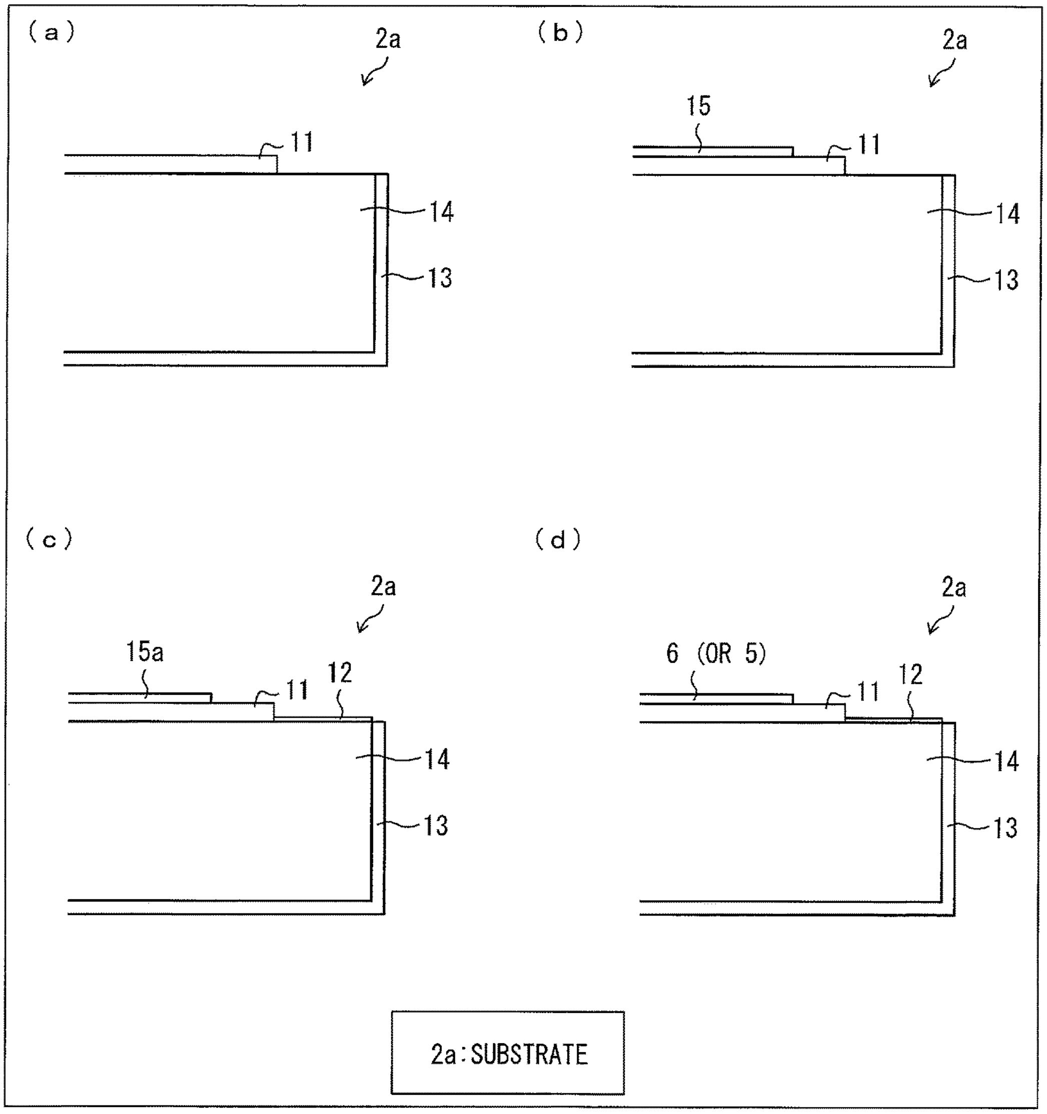
FIG. 20 shows illustrations for explaining a process for producing a light-emitting device substrate in embodiment 2.

FIG. 20 shows illustrations for explaining the process for producing the light-emitting device substrate 2*a*. In this production process, the step of forming the base circuit pattern 15 is performed before the steps such as the chemical polishing step and the anodic oxidation that use an erosive chemical such as an etching solution or an acid.

First, a first step of providing the glass-based insulator layer 11 and the glass-based insulator layer 13 on the aluminum base 14 is performed as shown in FIG. 20(*a*), and then a second step of forming the base circuit pattern 15 on the glass-based insulator layer 11 is performed as shown in FIG. 20(*b*). Then a third step of polishing the surface of the aluminum base 14 that is not covered with the glass-based insulator layer 11 and the glass-based insulator layer 13 is performed. Next, a fourth step of subjecting the polished surface of the aluminum base 14 to anodic oxidation to thereby form a light reflecting surface covered with the anodized aluminum layer 12 is performed as shown in FIG. 20(*c*), and then a fifth step of subjecting the anodized aluminum layer 12 to pore sealing treatment is performed. In the fourth step, the resin coating layer on the base circuit pattern 15 is removed, and a base circuit pattern 15*a* is thereby formed. Finally, a sixth step of forming electrode patterns is performed as shown in FIG. 20(*d*), and the light-emitting device substrate 2*a* is thereby produced.

In the production process shown in FIG. 20, the step of removing the resin coating layer on the base circuit pattern 15 can be included in the third step of polishing the surface of the aluminum base 14 and/or the fourth step of subjecting the polished surface of the aluminum base 14 to anodic oxidation to thereby form a light reflecting surface covered with the anodized aluminum layer 12.

Specifically, in the production process shown in FIG. 20, the step of forming the base circuit pattern is performed before the steps such as the chemical polishing and aluminum anodization that use an erosive chemical such as an etching solution or an acid. Therefore, the resin coating layer on the surface of the base circuit pattern 15 can be removed by the chemical polishing or aluminum anodization that use an erosive chemical such as an etching solution or an acid.

In the present embodiment, a suitable combination of an erosive chemical and a metal paste that forms a base circuit pattern 15 including a resin coating layer suitably eroded by the erosive chemical is selected and used.

In the step of forming the anodic oxide coating by anodic oxidation, an acidic solution used as a processing solution may not be able to fully remove the resin coating layer covering the conductive layer serving as the base of the electrode patterns. In this case, a step of removing the resin coating layer may be added, or a standard procedure may be used. Specifically, the anodic oxidation step is first performed, and then the step of forming the conductive layer serving as the base of the electrode patterns, the step of removing the resin coating layer covering the conductive layer serving as the base of the electrode patterns, and the plating step of forming the electrode patterns on the conductive layer may be performed in this order.

Embodiment 3

Next, embodiment 3 of the present invention will be described with reference to FIGS. 21 and 22. The present embodiment shows an application example of the light-emitting device 1 including the light-emitting device substrate 2 or the light-emitting device substrate 2*a*. For convenience of description, members having the same functions as those of members shown in the figures in embodiments 1 and 2 described above are denoted by the same symbols, and the description thereof will be omitted.

(Light-Emitting Device having High Heat Dissipation Capability)

Figure 21:
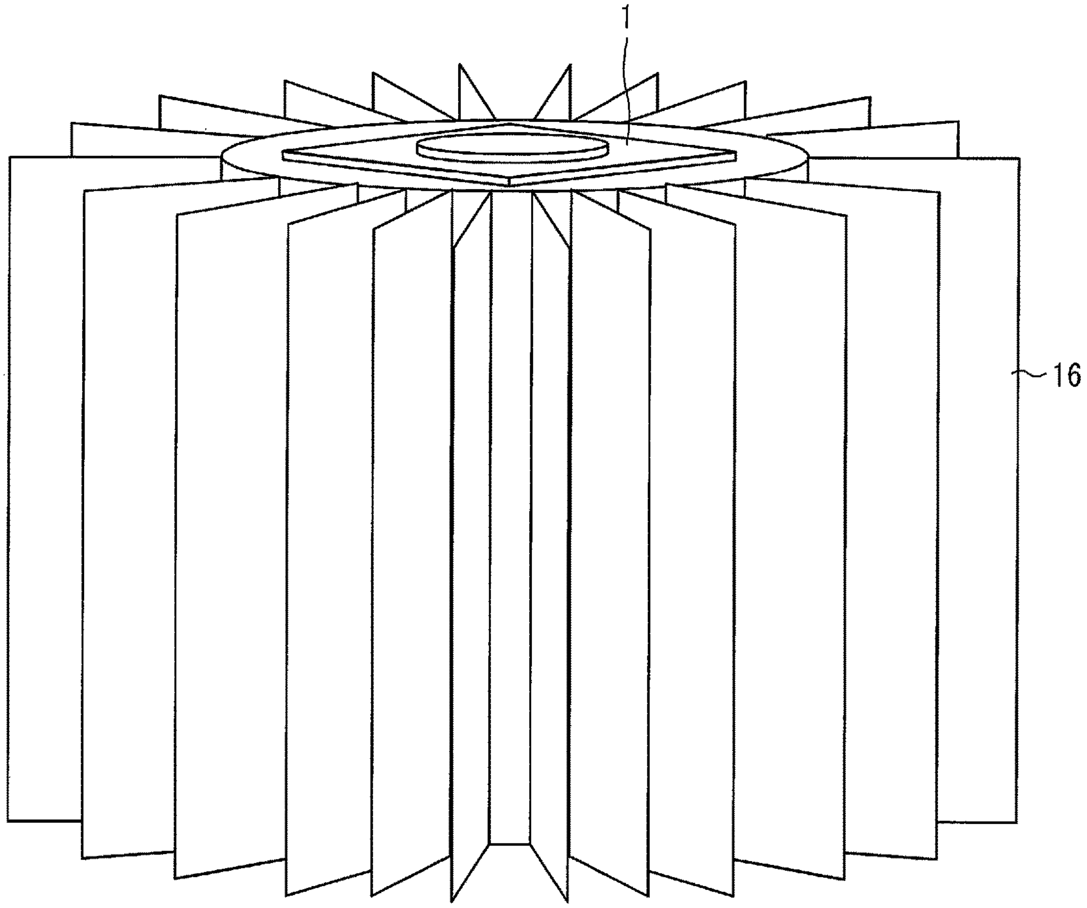
FIG. 21 is an illustration showing a schematic structure of a light-emitting device in embodiment 3.

FIG. 21 is an illustration showing a schematic structure of a light-emitting device in one embodiment of the present invention that has high heat dissipation capability.

As illustrated, the light-emitting device 1 including the light-emitting device substrate 2 or the light-emitting device substrate 2*a* is disposed on a heat sink 16 having a very large volume, and a light-emitting device having high heat dissipation capability is thereby realized.

Figure 22:
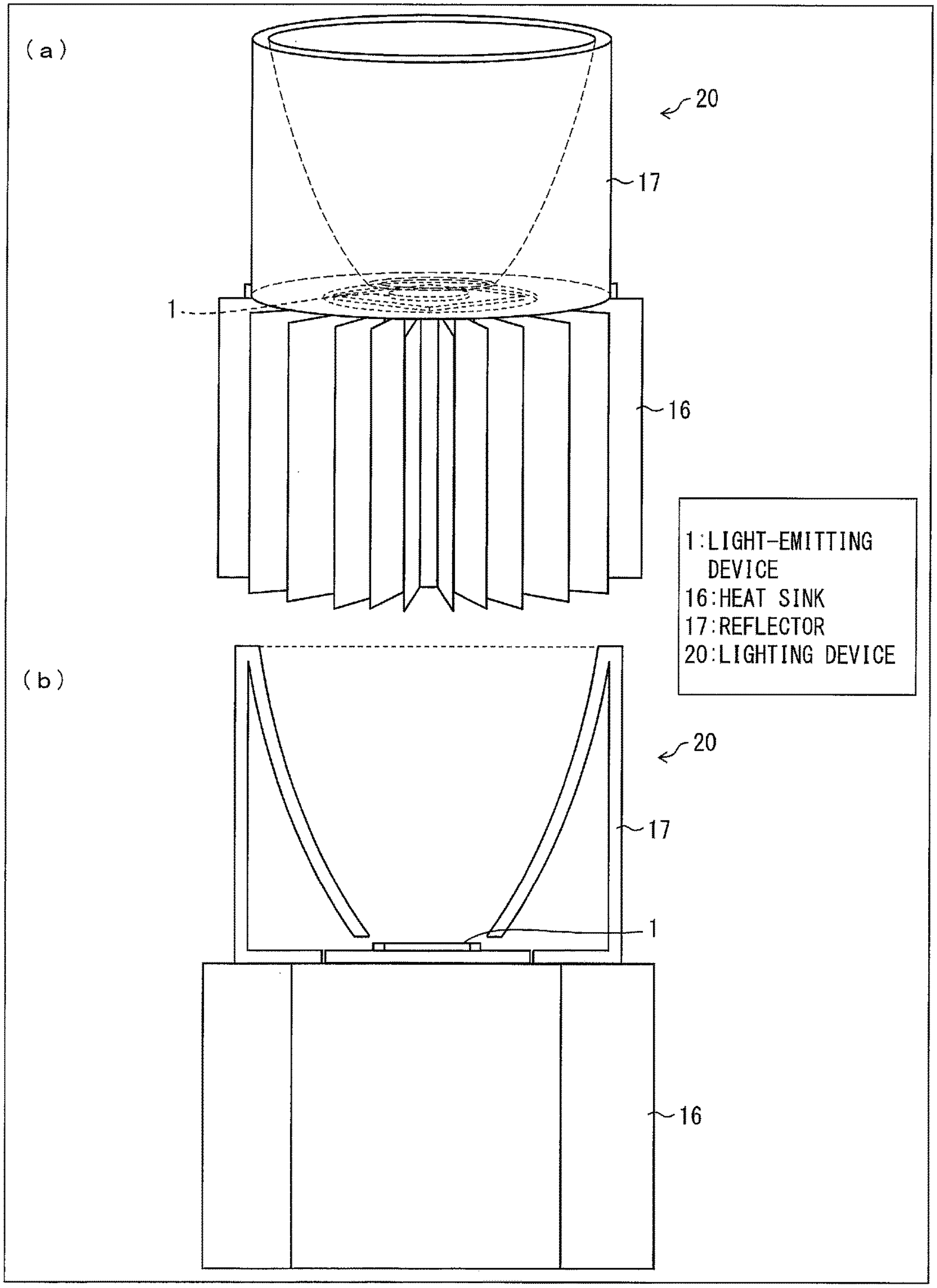
FIG. 22 shows illustrations of a schematic structure of a lighting device in embodiment 3.

FIG. 22 shows illustrations of a schematic structure of a lighting device in one embodiment of the present invention that has high heat dissipation capability.

As shown in FIGS. 22(*a*) and 22(*b*), the lighting device (light-emitting device) 20 is configured to include: the light-emitting device 1 disposed on the heat sink 16 and including the light-emitting device substrate 2 or the light-emitting device substrate 2*a*; and a reflector 17 formed so as to cover the light-emitting device 1.

As described above, in the present embodiment, by combining the heat sink 16 and the light-emitting device 1 including the light-emitting device substrate 2 or the light-emitting device substrate 2*a*, a light-emitting device having improved heat dissipation capability and a lighting device 20 having improved heat dissipation capability are realized.

Embodiment 4

Next, embodiment 4 of the present invention will be described with reference to FIG. 23. The present embodiment is different from embodiments 1 and 2 above in that, in the process for producing light-emitting device substrates, a relatively large aluminum substrate is divided into individual substrates in the final stage of production to prepare cut light-emitting device substrates. The rest of the configuration is as described in embodiments 1 and 2. For convenience of description, members having the same functions as those of members shown in the figures in embodiments 1 and 2 described above are denoted by the same symbols, and the description thereof will be omitted.

Figure 23:
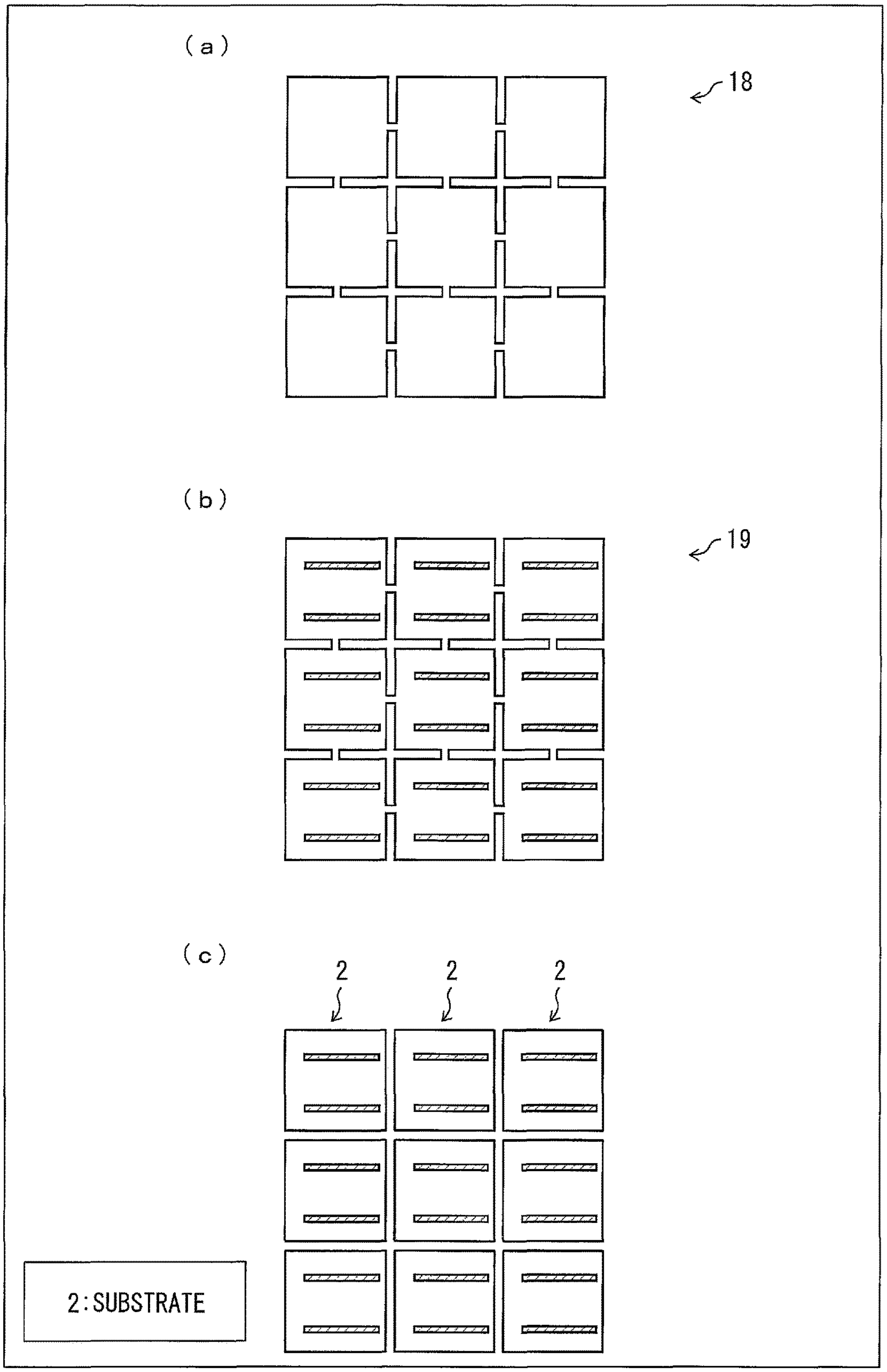
FIG. 23 shows illustrations for explaining a process for producing a light-emitting device substrate in embodiment 4.

FIG. 23 shows illustrations for explaining the process for producing light-emitting device substrates in one embodiment of the present invention in which a relatively large aluminum substrate is used.

As shown in FIG. 23(*a*), an aluminum plate 18 processed in advance so as to be easily cut is prepared.

Then an aluminum plate 19 subjected to the process described using FIG. 3 in embodiment 1 or the process described using FIG. 20 in embodiment 2 is prepared as shown in FIG. 23(*b*).

Finally, as shown in FIG. 23(*c*), the aluminum plate 19 is divided, and a plurality of cut light-emitting device substrates 2 (or cut light-emitting device substrates 2*a*) can thereby be obtained.

In the present embodiment, the relatively large aluminum substrate is divided into cut individual light-emitting device substrates in the final production stage, but this not a limitation. The relatively large aluminum substrate may be cut in an intermediate production stage, and the rest of the production process may be performed on the cut aluminum substrates.

The aluminum plate 19 may not be divided into individual substrates, and the undivided aluminum plate 19 itself may be used as a light-emitting device substrate. When the undivided aluminum plate 19 is used as a light-emitting device substrate, the light-emitting device substrate serves as a light-emitting module having a plurality of light-emitting regions.

Embodiment 5

Next, embodiment 5 of the present invention will be described with reference to FIGS. 24 and 25. The present embodiment is different from embodiments 1 and 2 described above in that insulator layers using a fluorocarbon resin, insulator layers using a thermosetting resin such as a silicone resin, or insulator layers of an epoxy resin or a polyimide resin are used instead of the glass-based insulator layers. The rest of the configuration is as described in embodiments 1 and 2. For convenience of description, members having the same functions as those of members shown in the figures in embodiments 1 and 2 described above are denoted by the same symbols, and the description thereof will be omitted.

Figure 24:
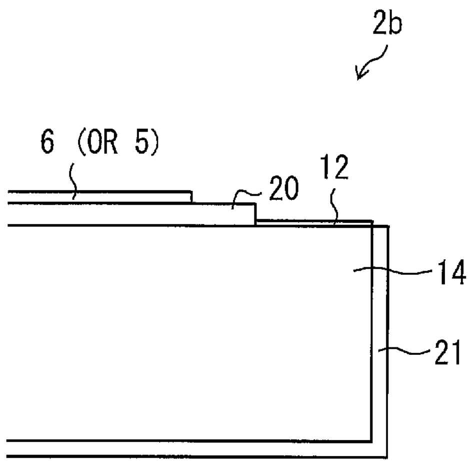
FIG. 24 is an illustration showing a schematic structure of a light-emitting device substrate in embodiment 5.

FIG. 24 is an illustration showing a schematic structure of a light-emitting device substrate 2*b* that uses insulator layers using a fluorocarbon resin instead of the glass-based insulator layers.

As illustrated, regions of the aluminum base 14 of the light-emitting device substrate 2*b* that are not covered with the anodized aluminum layer 12 (regions other than the light reflecting surface) are covered with an insulator layer 20 using a fluorocarbon resin and an insulator layer 21 using the fluorocarbon resin.

Figure 25:
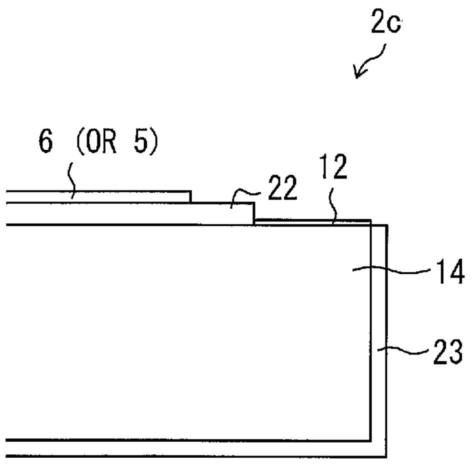
FIG. 25 is an illustration showing a schematic structure of another light-emitting device substrate in embodiment 5.

FIG. 25 is an illustration showing a schematic structure of a light-emitting device substrate 2*c* that uses insulator layers using a thermosetting resin such as silicone resin instead of the glass-based insulator layers.

As illustrated, regions of the aluminum base 14 of the light-emitting device substrate 2*c* that are not covered with the anodized aluminum layer 12 are covered with an insulator layer 22 using a thermosetting resin such as a silicone resin and an insulator layer 23 using the thermosetting resin such as a silicone resin.

Among insulator layers formed so as to have the same thickness, glass-based insulator layers are superior from the viewpoint of dielectric withstand capability. However, insulator layers using a fluorocarbon resin or insulator layers using a thermosetting resin such as a silicone resin other than the glass-based insulator layers may be appropriately selected according to the intended purpose or application of the light-emitting device substrate.

Examples of the insulator layer 22 using the thermosetting resin such as a silicone resin and the insulator layer 23 using the thermosetting resin such as a silicone resin include thermosetting resins and thermosetting resins containing ceramics.

A silicone resin, which is one of the thermosetting resins, is particularly excellent in dielectric withstand capability and heat resistance, is a chemically stable material, is flame retardant, and therefore has good properties.

To form insulator layers using a thermosetting resin, the thermosetting resin is applied to the aluminum base, then dried, and cured, whereby the insulator layers can be easily obtained.

When a thermosetting resin typified by a silicone resin is used to form insulator layers on the aluminum base, the insulator layers can be easily formed at a relatively low temperature of 200° C. or lower. In this case, the aluminum base is prevented from being damaged by heat, and the cost of production can be reduced.

The thermal conductivity of the silicone resin is very low, about 0.2 W/(m·° C.). To compensate for the low thermal conductivity of the silicone resin, ceramic particles typified by alumina, zirconia, titanium oxide, or aluminum nitride particles may be mixed into the silicone resin used so that the thermal conductivity is improved while the dielectric withstand capability is not impaired. When portions covered with the insulator layers are spaced apart from the light reflecting surface, black particles such as silicon carbide or silicon nitride particles may be mixed as ceramic particles. When no ceramic particles are mixed into the thermosetting resin and the thermal conductivity of the thermosetting resin used is not improved, the layer thickness of the thermosetting resin must be reduced to the extent that the dielectric withstand capability is not impaired. The layer thickness is preferably 100 μm or less.

Generally, the silicone resin is decomposed into gas at 200° C. or higher, so that the heat resistance and chemical stability of the silicone resin are worse than those of glass. Therefore, when a thermosetting resin typified by the silicone resin is used for the insulator layers of the light-emitting device substrate, it is necessary to use the thermosetting resin under appropriate conditions in consideration of the above characteristics.

The resin used instead of the glass-based insulator layers may be a thin film of a fluorocarbon resin typified by PTFE (polytetrafluoroethylene) or PFA (perfluoroalkoxy). Such a fluorocarbon resin has better insulating properties and heat resistance than the silicone resin and is chemically stable and flame retardant.

In addition, the fluorocarbon resin can be fused at a high temperature of 300° C. or higher and a high pressure so as to cover the aluminum base. The thermal conductivity of the fluorocarbon resin is very low, i.e., about 0.25 W/(m·° C.), which is similar to that of the silicone resin. Therefore, it is necessary that the fluorocarbon resin for the insulator layers of the aluminum base be 200 μm or less and more preferably 100 μm or less.

One method for improving the low thermal conductivity of the fluorocarbon resin without deterioration in dielectric withstand capability is to mix ceramic particles typified by alumina, zirconia, titanium oxide, aluminum nitride, silicon carbide, or silicon nitride particles into the fluorocarbon resin to increase and improve the thermal conductivity, as described for the case of the silicone resin.

The above-described method for improving the thermal conductivity is applicable not only to the thermosetting resins typified by a silicone resin and the fluorocarbon resins such as PTFE and PFA but also to epoxy resins and polyimide resins.

Any suitable combination of the resins described above may be used for the resin insulator layers, and any combination of the resins and glass-based insulators may be used.

Embodiment 6

Next, embodiment 6 of the present invention will be described with reference to FIG. 26. The present embodiment is different from embodiments 1 and 2 described above in that the side surfaces of the aluminum base 14 are covered with the anodized aluminum layer 12. The rest of the configuration is as described in embodiments 1 and 2. For convenience of description, members having the same functions as those of members shown in the figures in embodiments 1 and 2 described above are denoted by the same symbols, and the description thereof will be omitted.

Figure 26:
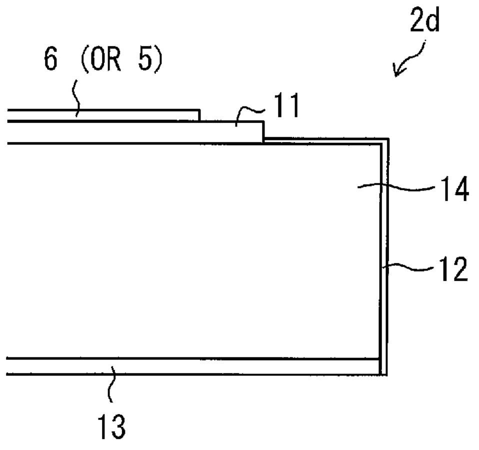
FIG. 26 is an illustration showing a schematic structure of a light-emitting device substrate in embodiment 6.

FIG. 26 is an illustration showing a schematic structure of a light-emitting device substrate 2*d* having a structure in which the side surfaces of the aluminum base 14 are covered with the anodized aluminum layer 12.

As illustrated, the thickness of the side surfaces of the light-emitting device substrate 2*d* is relatively small, and it is relatively difficult to perform the step of applying or printing the ceramic paint containing the ceramic and the glass raw material to or onto the aluminum base 14.

In the structure used in the present embodiment, the side surfaces of the light-emitting device substrate 2*d* are covered with the anodized aluminum layer 12. Therefore, the step of applying or printing the ceramic paint containing the ceramic and the glass raw material to or onto the side surfaces of the light-emitting device substrate 2*d* is unnecessary.

Embodiment 7

Next, embodiment 7 of the present invention will be described with reference to FIG. 27. The present embodiment is different from embodiments 1 and 2 described above in that the glass-based insulator layer 11 and the anodized aluminum layer 12 that are formed on the aluminum base 14 are different in shape from those in embodiments 1 and 2. The rest of the configuration is as described in embodiments 1 and 2. For convenience of description, members having the same functions as those of members shown in the figures in embodiments 1 and 2 described above are denoted by the same symbols, and the description thereof will be omitted.

Figure 27:
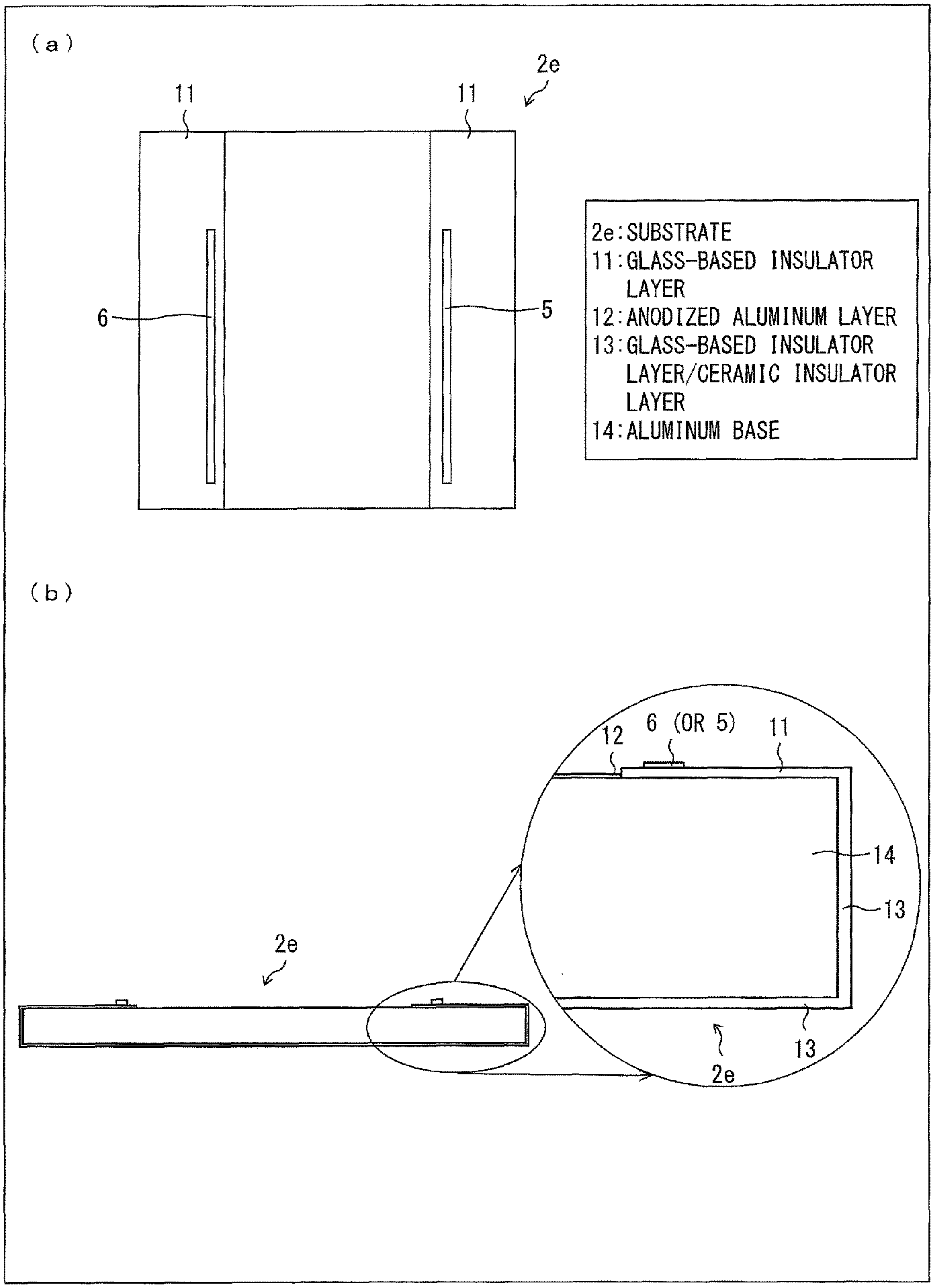
FIG. 27 shows illustrations of a schematic structure of another light-emitting device substrate in embodiment 6.

FIG. 27 shows illustrations of a schematic structure of a light-emitting device substrate 2*e*.

As shown in FIG. 27(*a*), the positive electrode pattern 5 and the negative electrode pattern 6 extending in the vertical direction in the figure are disposed on the light-emitting device substrate 2*e*.

As shown in FIGS. 27(*a*) and 27(*b*), the shapes of the glass-based insulator layer 11 and anodized aluminum layer 12 formed on the aluminum base 14 are different from those in the light-emitting device substrate 2 in embodiment 1 described using FIG. 2 (the positive electrode pattern 5 and the negative electrode pattern 6 are disposed so as to extend in the horizontal direction in FIG. 2).

SUMMARY

A light-emitting device substrate in aspect 1 of the present invention comprises a base formed of aluminum or a base containing aluminum in such an amount that the aluminum can undergo anodic oxidation. In the light-emitting device substrate, a light reflecting surface covered with an anodized aluminum coating is formed on one side of the base. On the one side of the base, a first insulating layer and an electrode pattern disposed on the first insulating layer are formed in a region that is not covered with the anodized aluminum coating. A second insulating layer is formed at least on the other side of the base that is opposite the one side of the base.

In the above configuration, the base formed of aluminum or the base containing aluminum in such an amount that the aluminum can undergo anodic oxidation is used, and the anodic oxidation of the base allows the light reflecting surface covered with the anodized aluminum coating to be formed.

The anodized aluminum coating formed on the one side of the base is extremely stable to heat and light, and the light reflecting surface covered with the anodized aluminum coating does not undergo discoloration etc. and can stably maintain high light reflectivity. The use of the anodized aluminum coating can improve long-term reliability. In addition, the anodized aluminum coating is excellent in mass productivity.

By forming the second insulating layer on the other side of the base that is opposite the one side of the base, high heat dissipation capability and dielectric withstand capability can be ensured.

As described above, in the light-emitting device substrate, the one side of the base on which the anodized aluminum coating is formed functions as the light reflecting surface, and the other side of the base that is opposite the one side of the base ensures high heat dissipation capability and dielectric withstand capability.

The first insulating layer is formed on the base in a region that is not covered with the anodized aluminum coating and is not easily delaminated.

Accordingly, a light-emitting device substrate having high reflectivity, high heat dissipation capability, dielectric withstand capability, and long-term reliability and excellent in mass productivity can be realized.

In aspect 2 of the present invention, the light-emitting device substrate has a configuration in which the second insulating layer is a ceramic layer or a glass-based insulator layer.

In the above configuration, the ceramic layer or the glass-based insulator layer having a high thermal resistance improvement effect is used as the second insulating layer. Therefore, a light-emitting device substrate with significantly improved thermal resistance can be realized.

In aspect 3 of the present invention, the light-emitting device substrate has a configuration in which the second insulating layer is an insulating layer formed of a resin.

In the above configuration, the second insulating layer is the insulating layer formed of the resin. Therefore, the second insulating layer can be relatively easily formed by applying or printing the resin to or onto the base and then drying and curing the resin. The second insulating layer formed of the resin can also be formed on the base by laminating a sheet of the resin to the base by fusion bonding or glueing or by using a molding technique typified by injection molding.

In aspect 4 of the present invention, the light-emitting device substrate has a configuration in which the second insulating layer is an insulating layer containing at least one of a fluorocarbon resin, a silicone resin, an epoxy resin, and a polyimide resin.

In the above configuration, the second insulating layer is formed as an insulating layer containing at least one of a fluorocarbon resin, a silicone resin, an epoxy resin, and a polyimide resin that are excellent in insulating properties and heat resistance and are chemically stable and uninflammable or flame retardant. Therefore, a light-emitting device substrate having both dielectric withstand capability and long-term reliability can be realized.

In the above configuration, the second insulating layer is formed as the insulating layer formed from a resin layer such as a silicone resin layer that can be easily formed at a relatively low temperature of 200° C. or lower. Therefore, the base formed of aluminum or the base containing aluminum in such an amount that the aluminum can undergo anodic oxidation can be prevented from being damaged by heat, and the production cost can be reduced.

In aspect 5 of the present invention, the light-emitting device substrate has a configuration in which the base has a thickness of 0.5 mm or more.

In the configuration in which the second insulating layer is formed on the other side of the base that is opposite the one side of the base, the base having a thickness of 0.5 mm or more is effective to reduce the thermal resistance.

With the above configuration, a light-emitting device substrate with significantly improved thermal resistance can be realized.

In the present invention, the thickness of the second insulating layer is assumed to be about 50 μm or more and about 150 μm or less, and the base having a thickness of 0.5 mm or more is sufficiently thicker than the second insulating layer. The thermal conductivity of the base formed of aluminum or the base containing aluminum in such an amount that the aluminum can undergo anodic oxidation is high. Therefore, even when the thickness of the base is large, its influence on the thermal resistance is small.

In aspect 6 of the present invention, the light-emitting device substrate has a configuration in which the first insulating layer is a glass-based insulator layer.

In the above configuration, the first insulating layer is formed as the glass-based insulator layer having high dielectric voltage. Since the glass-based insulator layer is formed on the base, the glass-based insulator layer resists delamination.

In aspect 7 of the present invention, the light-emitting device substrate has a configuration in which the first insulating layer is an anodized aluminum coating.

In the above configuration, the first insulating layer is formed as the anodized aluminum coating used to form the light reflecting surface.

Therefore, the first insulating layer and the light reflecting surface can be formed relatively easily.

In aspect 8 of the present invention, the light-emitting device substrate has a configuration in which the first insulating layer is an insulating layer containing at least one of a fluorocarbon resin, a silicone resin, an epoxy resin, and a polyimide resin.

In the above configuration, the first insulating layer is formed as the insulating layer containing at least one of a fluorocarbon resin, a silicone resin, an epoxy resin, and a polyimide resin that are excellent in insulating properties and heat resistance and are chemically stable and uninflammable. Therefore, a light-emitting device substrate having long-term reliability can be realized.

In the above configuration, the first insulating layer can be formed as a silicone resin insulating layer that can be formed relatively easily at a relatively low temperature of 200° C. or lower. Therefore, the base formed of aluminum or the base containing aluminum in such an amount that the aluminum can undergo anodic oxidation can be prevented from being damaged by heat, and the production cost can be reduced.

In aspect 9 of the present invention, the light-emitting device substrate has a configuration in which at least part of the side surfaces of the base are covered with any of a ceramic layer, a glass-based insulator layer, an insulator layer formed of a resin, and an anodized aluminum coating.

With the above configuration, even when the light-emitting device substrate accidentally comes into contact with its surroundings, the dielectric withstand capability of the light-emitting device substrate can be ensured.

In aspect 10 of the present invention, the light-emitting device substrate has a configuration in which the glass-based insulator layer is an insulating layer containing a glassy material or an insulating layer containing the glassy material and a ceramic.

In the above configuration, the glass-based insulator layer is formed as the insulating layer containing at least the glassy material in order to ensure the necessary dielectric withstand capability. For the purpose of reducing the thermal resistance of the glass-based insulator layer, the insulating layer used may contain a ceramic added to the glassy material.

Preferably, the ceramic does not impair the dielectric withstand capability but reduces thermal resistance.

When the portion covered with the glass-based insulator layer is spaced apart from the light reflecting surface, the light absorption properties of the ceramic mixed are not particularly specified.

The ceramic is not limited to a metal oxide. The ceramic may be a more general inorganic solid material, such as aluminum nitride, other than metal oxides, so long as it is a stable inorganic solid material that does not impair the dielectric withstand capability of the glassy material but reduces thermal resistance.

In aspect 11 of the present invention, the light-emitting device substrate has a configuration in which the glass-based insulator layer is an insulating layer containing a sintered body of a glassy material or an insulating layer containing a sintered body of the glassy material and a ceramic.

In the above configuration, the glass-based insulator layer is the insulating layer containing a sintered body of a glassy material or the insulating layer containing a sintered body of the glassy material and a ceramic. Therefore, the insulator layer obtained adheres closely to the base and is stable.

In aspect 12 of the present invention, the light-emitting device substrate has a configuration in which the ceramic includes particles formed of at least one of aluminum nitride, alumina, zirconia, and titanium oxide.

In the above configuration, while the necessary dielectric withstand capability of the light-emitting device substrate is ensured, the thermal resistance can be reduced.

A light-emitting device in aspect 13 of the present invention has a configuration in which at least one light-emitting element is disposed on the light reflecting surface side of the light-emitting device substrate and an electrode of the light-emitting element is electrically connected to the electrode pattern formed on the light-emitting device substrate.

With the above configuration, a light-emitting device having high reflectivity, high heat dissipation capability, dielectric withstand capability, and long-term reliability and excellent in mass productivity can be realized.

A light-emitting device in aspect 14 of the present invention has a configuration in which a plurality of light-emitting elements are disposed on the light reflecting surface and the spacing between adjacent ones of the light-emitting elements is at least two times the thickness of the second insulating layer.

With the above configuration, a light-emitting device having low thermal resistance and high heat dissipation capability can be realized.

A light-emitting device in aspect 15 of the present invention has a configuration in which a plurality of light-emitting elements are disposed on the light reflecting surface and the thickness of the base is at least one-half the spacing between adjacent ones of the light-emitting elements.

With the above configuration, a light-emitting device having low thermal resistance and high heat dissipation capability can be realized.

In aspect 16 of the present invention, the light-emitting device has a configuration in which the light-emitting elements are light-emitting diodes and the light-emitting diodes are covered with a sealing resin.

With the above configuration, a light-emitting device including light-emitting diodes, having high reflectivity, high heat dissipation capability, dielectric withstand capability, and long-term reliability, and excellent in mass productivity can be realized.

In aspect 17 of the present invention, the light-emitting device has a configuration in which the sealing resin contains a phosphor.

In the above configuration, the sealing resin contains a phosphor. Therefore, a light-emitting device capable of emitting light with a desired color can be realized.

A light-emitting device substrate production method in aspect 18 of the present invention is a method for producing a light-emitting device substrate including a base formed of aluminum or a base containing aluminum in such an amount that the aluminum can undergo anodic oxidation. The method comprises the steps of: subjecting the base to the anodic oxidation to form a light reflecting surface covered with an anodized aluminum coating on one side of the base; forming a first insulating layer on the one side of the base in a region that is not covered with the anodized aluminum coating (a region other than the light reflecting surface); forming a conductive layer on the first insulating layer; forming an electrode pattern on the conductive layer; and forming a second insulating layer at least on the other side of the base that is opposite the one side of the base.

In the above method, the base formed of aluminum or the base containing aluminum in such an amount that the aluminum can undergo anodic oxidation is used. The light reflecting surface covered with the anodized aluminum coating can be formed by anodic oxidation of the base used.

The anodized aluminum coating formed on the one side of the base is extremely stable to heat and light, and the light reflecting surface covered with the anodized aluminum coating does not undergo discoloration etc. and can stably maintain high light reflectivity. The use of the anodized aluminum coating can improve long-term reliability. In addition, the anodized aluminum coating is excellent in mass productivity.

By forming the second insulating layer on the other side of the base that is opposite the one side of the base, high heat dissipation capability and dielectric withstand capability can be ensured.

As described above, in the light-emitting device substrate produced by the above-described method, the one side of the base on which the anodized aluminum coating is formed functions as the light reflecting surface, and the other side of the base that is opposite the one side of the base ensures high heat dissipation capability and dielectric withstand capability.

The first insulating layer is formed in a region of the base that is not covered with the anodized aluminum coating (a region other than the light reflecting surface) and is not easily delaminated.

With the above light-emitting device substrate production method, a light-emitting device substrate having high reflectivity, high heat dissipation capability, dielectric withstand capability, and long-term reliability and excellent in mass productivity can be realized.

In the light-emitting device substrate production method in aspect 19 of the present invention, in the step of forming the second insulating layer, ceramic particles are injected onto the other side of the base that is opposite the one side of the base at high speed to deposit a ceramic layer to thereby form the second insulating layer.

In the above method, since the ceramic layer having a high thermal resistance improving effect is used as the second insulating layer, a light-emitting device substrate with significantly improved thermal resistance can be realized.

In the light-emitting device substrate production method in aspect 20 of the present invention, in the step of forming the second insulating layer, a paint containing a glass raw material is applied to the other side of the base that is opposite the one side of the base and then sintered or dried by heating to form a glassy material, whereby the second insulating layer containing the glassy material is formed.

In the above method, the insulating layer containing the glassy material having a high thermal resistance improving effect is used as the second insulating layer. Therefore, a light-emitting device substrate with significantly improved thermal resistance can be realized.

In the light-emitting device substrate production method in aspect 21 of the present invention, in the step of forming the second insulating layer, the paint containing the glass raw material contains glassy material particles.

In the step of forming the second insulating layer in the above method, particles that have already been vitrified, such as silica particles, can be added to the glassy material formed by drying and sintering. Therefore, a light-emitting device substrate including the second insulating layer having stable characteristics can be realized.

In the light-emitting device substrate production method in aspect 22 of the present invention, in the step of forming the second insulating layer, the paint containing the glass raw material contains a ceramic.

In the step of forming the second insulating layer in the above method, the insulating layer used is formed of the glassy material that contains the ceramic for the purpose of reducing the thermal resistance. Therefore, a light-emitting device substrate with significantly improved thermal resistance can be realized.

In the light-emitting device substrate production method in aspect 23 of the present invention, the ceramic includes particles formed of at least one of aluminum nitride, alumina, zirconia, and titanium oxide.

With the above method, a light-emitting device substrate reduced in thermal resistance while the necessary dielectric withstand capability is ensured can be realized.

In the light-emitting device substrate production method in aspect 24 of the present invention, before the step of subjecting the one side of the base to anodic oxidation to form the light reflecting surface covered with the anodized aluminum coating, a polishing step of subjecting at least part of the surface of the base that forms the light reflecting surface to polishing treatment is performed.

With the above method, a light-emitting device substrate having a high-intensity light reflecting surface can be realized.

In the light-emitting device substrate production method in aspect 25 of the present invention, the polishing step is performed using at least one of a buffing method, a chemical polishing method, and an electrolytic polishing method.

With the above method, a light-emitting device substrate having a high-intensity light reflecting surface can be produced relatively easily.

In the light-emitting device substrate production method in aspect 26 of the present invention, the same process is used to form the first insulating layer in the step of forming the first insulating layer and the second insulating layer in the step of forming the second insulating layer.

With the above method, a light-emitting device substrate can be produced using a simpler production process.

In the light-emitting device substrate production method in aspect 27 of the present invention, the step of forming the first insulating layer is performed through the step of subjecting the one side of the base to anodic oxidation to thereby form the light reflecting surface covered with the anodized aluminum coating.

With the above method, a light-emitting device substrate can be produced using a simpler production process.

In the light-emitting device substrate production method in aspect 28 of the present invention, in the step of forming the first insulating layer and/or the step of forming the second insulating layer, a paint containing a glass raw material is applied to the other side of the base that is opposite the one side of the base, and then the glass raw material is reacted by a sol-gel process to form a glassy material, whereby the first insulating layer and/or the second insulating layer is formed.

With the above method, an insulating layer formed of the glassy material can be formed at relatively low temperature. Therefore, even when a low-melting point metal such as aluminum having a melting point of 660° C. is a main component of the base, a light-emitting device substrate can be produced with no heat damage to the base.

In the light-emitting device substrate production method in aspect 29 of the present invention, when the first insulating layer and/or the second insulating layer is formed by reacting the glass raw material using the sol-gel process, the step of forming the first insulating layer and/or the step of forming the second insulating layer includes the step of sintering at 250° C. to 500° C.

In the above method, the sol-gel process is used. Therefore, by performing sintering within the temperature range of 250° C. to 500° C., a light-emitting device substrate including a stable first insulating layer formed of the glassy material and/or a stable second insulating layer formed of the glassy material can be produced.

In the light-emitting device substrate production method in aspect 30 of the present invention, the step of forming the second insulating layer includes the step of injecting ceramic particles at high speed by a thermal spraying method or an AD method (an aerosol deposition method) to deposit a ceramic layer.

In this case, alumina, aluminum nitride, etc. may be used as the raw material of the ceramic particles.

With the above method, a light-emitting device substrate reduced in thermal resistance while the necessary dielectric withstand capability is ensured can be produced.

In the light-emitting device substrate production method in aspect 31 of the present invention, the step of forming the light reflecting surface is performed after the step of forming the first insulating layer and the step of forming the second insulating layer.

Alternatively, in this method, the step of forming the first insulating layer through the step of forming the light reflecting surface is performed after the step of forming the second insulating layer.

With the above method, cracking of the anodized aluminum coating can be prevented.

When the step of forming the second insulating layer that requires a process at at least 250° C. to 500° C. is performed after the formation of the anodized aluminum coating, the anodized aluminum coating is cracked. When the subsequent steps are performed with the anodized aluminum coating cracked, various problem occur (for example, when a plating step of forming the electrode pattern is performed, the plating is deposited on the cracks, and an electrical short circuit may occur because of the paling deposited on the cracks).

When the light reflecting surface is formed after the formation of the first insulating layer and the second insulating layer or the formation of the second insulating layer, each insulating layer serves as a mask for the anodic oxide coating during the anodic oxidation for forming the light reflecting surface.

In the light-emitting device substrate production method in aspect 32 of the present invention, the step of forming the electrode pattern on the conductive layer is performed after the step of forming the light reflecting surface, the step of forming the first insulating layer, and the step of forming the second insulating layer.

With the above method, the step of forming the electrode pattern on the conductive layer is performed with the entire surface of the base covered with the anodized aluminum coating, the first insulating layer, and the second insulating layer.

Therefore, in the step of forming the electrode pattern on the conductive layer, the plating can be prevented from being deposited on regions other than the conductive layer serving as the base of the electrode pattern.

In addition, erosion of the base by the plating solution can be prevented.

With the above method, application and removal of a protective sheet necessary for the purpose of preventing erosion by the plating solution and deposition of the plating on unwanted regions can be omitted, and improvement in mass productivity can be achieved.

In the light-emitting device substrate production method in aspect 33 of the present invention, the step of forming the light reflecting surface is performed between the step of forming the conductive layer on the first insulating layer and the step of forming the electrode pattern on the conductive layer.

In the step of forming the conductive layer on the first insulating layer, a conductive paste containing a conductive metal such as Ag is generally used. The conductive paste is applied to the surface of the base by, for example, printing, then dried, and cured. The surface of the paste after curing is generally covered with an insulating coating (resin coating layer) formed of a resin used as the binder of the paste. Therefore, before the step of forming the electrode pattern by plating is performed, the coating covering the conductive layer must be removed by, for example, etching treatment to ensure electrical conductivity, and then the plating treatment is performed.

In the above method, the step of forming the light reflecting surface is used in place of the step of removing the resin coating layer covering the conductive layer, and one step can be omitted.

In the step of forming the light reflecting surface, an acidic solution such as an aqueous sulfuric acid solution is generally used as a processing solution. Therefore, when a material that can appropriately dissolve in the acidic solution is selected as the binder of the conductive paste, the step of removing the resin coating layer and the step of forming the light reflecting surface can be performed simultaneously, and the step of forming the electrode pattern on the conductive layer can be performed immediately after the step of forming the light reflecting surface.

In the light-emitting device substrate production method in aspect 34 of the present invention, a pore sealing treatment step is included in the step of forming the light reflecting surface or in the step of forming the first insulating layer through the step of forming the light reflecting surface.

In the above method, since the pore sealing treatment step is included in the step of forming the light reflecting surface or in the step of forming the first insulating layer through the step of forming the light reflecting surface, the anodized aluminum coating is further stabilized, and the progress of oxidation is suppressed, whereby a light-emitting device substrate with further improved long-term reliability can be achieved.

In the light-emitting device substrate production method in aspect 35 of the present invention, a base formed of aluminum or a base containing aluminum in such an amount that the aluminum can undergo anodic oxidation is used. Each of the bases includes a plurality of light-emitting device substrates integrated with each other. After the base used is subjected to the final stage of production or to an intermediate stage of production, the base is divided into a plurality of individual light-emitting device substrates.

With the above method, light-emitting device substrates can be produced more efficiently.

A light-emitting device in aspect 36 of the present invention is configured to include a heat sink.

With the above configuration, a light-emitting device having higher heat dissipation capability can be realized.

The present invention is not limited to the embodiments described above, and various modifications are possible within the scope shown in the claims. Embodiments obtained by appropriately combining technical means disclosed in different embodiments are also included in the technical scope of the present invention.

INDUSTRIAL APPLICABILITY

The present invention can be suitably used for a light-emitting device substrate, a light-emitting device using the light-emitting device substrate, and a method for producing the light-emitting device substrate.

REFERENCE SIGNS LIST

1 light-emitting device
2 substrate (light-emitting device substrate)
**2*a*** substrate (light-emitting device substrate)
**2*b*** substrate (light-emitting device substrate)
**2*c*** substrate (light-emitting device substrate)
**2*d*** substrate (light-emitting device substrate)
**2*e*** substrate (light-emitting device substrate)
3 positive electrode connector
4 negative electrode connector
5 positive electrode pattern
6 negative electrode pattern
7 light-emitting element
8 wire
9 sealing resin
10 sealing resin-surrounding frame
11 glass-based insulator layer (first insulating layer)
12 anodized aluminum layer (anodized aluminum coating)
13 glass-based insulator layer/ceramic insulator layer (second insulating layer)
14 aluminum base (base)
15 base circuit pattern
**15*a*** base circuit pattern with resin coating layer removed
16 heat sink
17 reflector
18 aluminum plate
19 aluminum plate
20 lighting device

The invention claimed is:

1. A method for producing a light-emitting device including a plurality of light-emitting elements and a light-emitting device substrate including a base that includes aluminum, the method comprising:

(a) forming, as an integral portion of one side of the base, a light reflecting surface that is exposed to an outside atmosphere by subjecting the one side of the base to anodic oxidation, the light reflecting surface being an anodized aluminum coating;

(b) forming a first insulating layer on the one side of the base in a region other than the light reflecting surface;

(c) forming an electrode pattern on the first insulating layer; and (d) forming a second insulating layer at least on the other side of the base that is opposite the one side of the base, wherein the step (a) is performed after the step (b), the plurality of light-emitting elements are on the anodized aluminum coating of the light-emitting device substrate, a spacing between adjacent ones of the plurality of light-emitting elements is at least two times a thickness of the second insulating layer, a thickness of the base is 10 mm or less and at least one-half the spacing, the step (c) includes the sub-steps of:

(h) forming a conductive layer on the first insulating layer; and (i) forming an electrode pattern on the conductive layer, and the step (a) is performed between the sub-step (h) and the sub-step (i).

* * * * *